United States Patent
Nosaka

(10) Patent No.: US 10,720,903 B2
(45) Date of Patent: Jul. 21, 2020

(54) ACOUSTIC WAVE FILTER DEVICE, RADIO-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Koji Nosaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/283,868

(22) Filed: Feb. 25, 2019

(65) Prior Publication Data

US 2019/0190494 A1 Jun. 20, 2019

Related U.S. Application Data

(63) Continuation of application No. PCT/JP2017/031267, filed on Aug. 30, 2017.

(30) Foreign Application Priority Data

Sep. 2, 2016 (JP) ................................. 2016-172176

(51) Int. Cl.
*H03H 9/64* (2006.01)
*H03H 9/145* (2006.01)
(Continued)

(52) U.S. Cl.
CPC ........ *H03H 9/6483* (2013.01); *H03H 7/0161* (2013.01); *H03H 9/1457* (2013.01);
(Continued)

(58) Field of Classification Search
CPC ............... H03H 9/6483; H03H 7/0161; H03H 9/14541; H03H 9/1457; H03H 9/205;
(Continued)

(56) References Cited

U.S. PATENT DOCUMENTS 6,472,953 B1 10/2002 Sakuragawa et al.
2006/0131992 A1 6/2006 Nakao et al.
(Continued)

FOREIGN PATENT DOCUMENTS

JP 2000-323961 A 11/2000
JP 2008-131128 A 6/2006
(Continued)

OTHER PUBLICATIONS

Marked machine translation of the foreign prior art Akio (JP2014068123), (Year: 2014).*

(Continued)

*Primary Examiner* — Benny T Lee
*Assistant Examiner* — Hafizur Rahman
(74) *Attorney, Agent, or Firm* — Keating & Bennett, LLP

(57) ABSTRACT

A filter includes a series-arm resonator connected on a path connecting input/output terminals, and first and second parallel-arm resonators connected between the same node on the path and ground. A resonant frequency of the second parallel-arm resonator is higher than a resonant frequency of the first parallel-arm resonator, and an anti-resonant frequency of the second parallel-arm resonator is higher than an anti-resonant frequency of the first parallel-arm resonator. Each of the first and second parallel-arm resonators includes an acoustic wave resonator including an IDT electrode. The IDT electrode in the second parallel-arm resonator has a higher duty ratio than the IDT electrode in the first parallel-arm resonator, where the duty ratio is the ratio of the width to the pitch of electrode fingers.

20 Claims, 16 Drawing Sheets

(51) Int. Cl.
    *H03H 7/01*    (2006.01)
    *H03H 9/205*   (2006.01)
    *H03H 9/25*    (2006.01)
    *H03H 9/72*    (2006.01)
    *H03H 9/54*    (2006.01)

(52) U.S. Cl.
    CPC ........ *H03H 9/14541* (2013.01); *H03H 9/205* (2013.01); *H03H 9/25* (2013.01); *H03H 9/6403* (2013.01); *H03H 9/6426* (2013.01); *H03H 9/725* (2013.01); *H03H 9/542* (2013.01)

(58) Field of Classification Search
    CPC ...... H03H 9/25; H03H 9/6403; H03H 9/6426; H03H 9/725; H03H 9/542
    USPC .......................................................... 333/193
    See application file for complete search history.

(56) References Cited

U.S. PATENT DOCUMENTS

| | | |
|---|---|---|
| 2007/0247259 A1 | 10/2007 | Takata |
| 2009/0201104 A1 | 8/2009 | Ueda et al. |
| 2010/0097161 A1 | 4/2010 | Nakamura et al. |
| 2012/0062329 A1 | 3/2012 | Yamanaka |
| 2017/0099044 A1 | 4/2017 | Takamine |
| 2017/0126204 A1 | 5/2017 | Takamine |
| 2018/0254763 A1* | 9/2018 | Yamamoto ............... H03H 9/25 |
| 2019/0190493 A1 | 6/2019 | Nosaka |

FOREIGN PATENT DOCUMENTS

| | | |
|---|---|---|
| JP | 2009-207116 A | 9/2009 |
| JP | 2010-252359 A | 11/2010 |
| JP | 2012-060422 A | 3/2012 |
| JP | 2013-090023 A | 5/2013 |
| JP | 2014-068123 A | 4/2014 |
| WO | 2005/011117 A1 | 2/2005 |
| WO | 2006/067935 A1 | 6/2006 |
| WO | 2016/013330 A1 | 1/2016 |
| WO | 2016/027707 A1 | 2/2016 |
| WO | 2016/031391 A1 | 3/2016 |
| WO | 2018/043606 A1 | 3/2018 |

OTHER PUBLICATIONS

Official Communication issued in International Patent Application No. PCT/JP2017/031267, dated Nov. 21, 2017.

Offical Communication issued in corresponding Korean Patent Application No. 10-2019-7005743, dated Apr. 29, 2020.

\* cited by examiner

ACOUSTIC WAVE FILTER DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-172176 filed on Sep. 2, 2016 and is a Continuation Application of PCT Application No. PCT/JP2017/031267 filed on Aug. 30, 2017. The entire contents of each of these applications are hereby incorporated herein by reference.

BACKGROUND OF THE INVENTION

1. Field of the Invention

The present invention relates to an acoustic wave filter device including resonators, a radio-frequency front-end circuit, and a communication apparatus.

2. Description of the Related Art

A known acoustic wave filter device such as a ladder filter includes a single parallel arm connecting a series arm and ground is provided with a first parallel-arm resonator and a plurality of second parallel-arm resonators connected in parallel to the first parallel-arm resonator while the plurality of second parallel-arm resonators are connected in series with each other (see, for example, Japanese Unexamined Patent Application Publication No. 2014-68123). In this acoustic wave filter device, the plurality of second parallel-arm resonators have resonant frequencies higher than an anti-resonant frequency of one or more series-arm resonators, and at least one of the plurality of second parallel-arm resonators has an anti-resonant frequency different from an anti-resonant frequency of the other second parallel-arm resonator(s). This configuration enables the acoustic wave filter device to increase the width of an attenuation range having a large attenuation within a specific frequency band in the stop band (attenuation band).

With the recent support for multi-band operation, a filter disposed in a front-end portion of a mobile communication device is required to have low loss and high selectivity (prevention of mutual interference with other bands adjacent to its own band). That is, for filter characteristics, it is required to reduce the loss within the pass band and to improve the steepness of attenuation slopes (called the "sharpness of the pass band edges").

However, in the known acoustic wave filter device described above, filter characteristics are restricted by the Qs of resonators, which makes it difficult to achieve low loss within the pass band and to improve the sharpness on the high-frequency side of the pass band. The improvement in the sharpness on the high-frequency side of the pass band refers to, specifically, the improvement of the steepness of a higher-side attenuation slope among two attenuation slopes from the pass band to the attenuation band on both sides of the pass band.

SUMMARY OF THE INVENTION

Preferred embodiments of the present invention provide acoustic wave filter devices, radio-frequency front-end circuits, and communication apparatuses that each are able to achieve low loss within the pass band and improved sharpness on the high-frequency side of the pass band.

An acoustic wave filter device according to a preferred embodiment of the present invention includes a series-arm resonant circuit that is connected on a path connecting a first input/output terminal and a second input/output terminal, and a first parallel-arm resonator and a second parallel-arm resonator that are connected between the same node on the path and ground. A resonant frequency of the second parallel-arm resonator is higher than a resonant frequency of the first parallel-arm resonator, and an anti-resonant frequency of the second parallel-arm resonator is higher than an anti-resonant frequency of the first parallel-arm resonator. Each of the first parallel-arm resonator and the second parallel-arm resonator includes an acoustic wave resonator including an IDT electrode. The IDT electrode in the second parallel-arm resonator has a higher duty ratio than the IDT electrode in the first parallel-arm resonator, the duty ratio being a ratio of a width of a plurality of electrode fingers to a pitch of the plurality of electrode fingers.

As a result of intensive research, the inventor of preferred embodiments of the present invention made the following discoveries. For impedance characteristics of a resonator alone, the higher the duty ratio of an IDT electrode, the higher the Q at the resonant frequency becomes. Conversely, the lower the duty ratio of an IDT electrode, the higher the Q at the anti-resonant frequency becomes. For filter characteristics, as the Q at the resonant frequency of the second parallel-arm resonator and the Q at the anti-resonant frequency of the first parallel-arm resonator increase, a lower loss within the pass band is able to be achieved and the sharpness on the high-frequency side of the pass band is able to be improved. Accordingly, setting the duty ratio of an IDT electrode of the second parallel-arm resonator to be higher than the duty ratio of an IDT electrode of the first parallel-arm resonator achieves low loss within the pass band and improved sharpness on the high-frequency side of the pass band.

Further, the series-arm resonant circuit may include an acoustic wave resonator including an IDT electrode, and the duty ratio of the IDT electrode in the first parallel-arm resonator may be lower than the duty ratio of the IDT electrode in the series-arm resonant circuit.

The pass band of a filter is defined by the resonant frequency of a series-arm resonant circuit and the lower anti-resonant frequency of a parallel-arm resonant circuit (in the present preferred embodiment, a parallel-connected circuit of the first parallel-arm resonator and the second parallel-arm resonator). As described above, for impedance characteristics of a resonator alone, the higher the duty ratio of an IDT electrode, the higher the Q at the resonant frequency becomes. Conversely, the lower the duty ratio of an IDT electrode, the higher the Q at the anti-resonant frequency becomes. Thus, the duty ratio of at least one or more IDT electrodes of the series-arm resonant circuit (one IDT electrode when the series-arm resonant circuit is a series-arm resonator; a plurality of IDT electrodes when the series-arm resonant circuit is a longitudinally coupled resonator) is able to be increased to increase the Q at the resonant frequency of the series-arm resonant circuit, thus achieving lower loss within the pass band.

Further, the first parallel-arm resonator and the second parallel-arm resonator may be connected in parallel.

The acoustic wave filter device may further include an impedance element and a switch element that are connected in parallel and that are connected in series with at least one of the first parallel-arm resonator and the second parallel-arm resonator.

Accordingly, it is possible to provide a tunable filter that switches between a first bandpass characteristic and a second bandpass characteristic in accordance with switching between the connection and disconnection of the switch element.

Further, the impedance element and the switch element that are connected in parallel may be connected in series with only the second parallel-arm resonator.

Accordingly, it is possible to provide a tunable filter that is capable of switching the attenuation pole frequency on the high-frequency side of the pass band in accordance with switching between the connection and disconnection of the switch element and that is capable of reducing or preventing the increase in insertion loss at the high-frequency end of the pass band.

Alternatively, the impedance element and the switch element that are connected in parallel may be connected in series with only the first parallel-arm resonator.

Accordingly, it is possible to provide a tunable filter that is capable of switching the attenuation pole frequency on the low-frequency side of the pass band in accordance with switching between the connection and disconnection of the switch element and that is capable of reducing or preventing the increase in insertion loss at the low-frequency end of the pass band.

Alternatively, the impedance element and the switch element that are connected in parallel may be connected in series with a circuit including the first parallel-arm resonator and the second parallel-arm resonator connected in parallel.

Accordingly, it is possible to provide a tunable filter that is capable of switching both pole (attenuation pole) frequencies on both sides of the pass band in accordance with switching between the connection and disconnection of the switch element.

The acoustic wave filter device may further include an impedance element and a switch element that are connected in parallel and that are connected in series with only the first parallel-arm resonator, and another impedance element and another switch element that are connected in parallel and that are connected in series with only the second parallel-arm resonator.

Accordingly, it is possible to provide a tunable filter that is capable of switching the attenuation pole frequencies on the high-frequency side of the pass band and the low-frequency side of the pass band in accordance with switching between the connection and disconnection of the switch element and that is capable of reducing or preventing the increase in insertion loss at the high-frequency end of the pass band and at the low-frequency end of the pass band. Thus, such a tunable filter is able to, for example, shift the center frequency while maintaining the band width.

Further, the first parallel-arm resonator and the second parallel-arm resonator may be connected in series.

The acoustic wave filter device may further include a switch element connected in parallel to one of the first parallel-arm resonator and the second parallel-arm resonator.

Accordingly, it is possible to provide a tunable filter that is capable of switching the attenuation pole frequency on the low-frequency side of the pass band in accordance with switching between the connection and disconnection of the switch element and that obtains attenuation on the high-frequency side of the pass band due to the generation of an additional attenuation pole on the high-frequency side of the pass band.

Further, the IDT electrode in the second parallel-arm resonator may have a lower aspect ratio than the IDT electrode in the first parallel-arm resonator, the aspect ratio being a ratio of an overlap width of a plurality of electrode fingers to the number of pairs of electrode fingers.

As a result of intensive research, the inventor of preferred embodiments of the present invention made the following discoveries. For impedance characteristics of a resonator alone, the lower the aspect ratio of an IDT electrode, the higher the Q at the resonant frequency becomes. Conversely, the higher the aspect ratio of an IDT electrode, the higher the Q at the anti-resonant frequency becomes. For filter characteristics, as the Q at the resonant frequency of the second parallel-arm resonator and the Q at the anti-resonant frequency of the first parallel-arm resonator increase, a lower loss within the pass band is able to be achieved and the sharpness on the high-frequency side of the pass band is able to be improved. Accordingly, setting the aspect ratio of an IDT electrode of the second parallel-arm resonator to be lower than the aspect ratio of an IDT electrode of the first parallel-arm resonator achieves lower loss within the pass band and further improved sharpness on the high-frequency side of the pass band.

Further, the series-arm resonant circuit may be a series-arm resonator including one or more acoustic wave resonators, and the series-arm resonant circuit, the first parallel-arm resonator, and the second parallel-arm resonator may define a ladder filter structure.

Accordingly, it is possible to provide a ladder band pass filter and to achieve a steep bandpass characteristic.

Further, the series-arm resonant circuit may be a longitudinally coupled resonator including a plurality of acoustic wave resonators.

Accordingly, filter characteristic requirements, such as attenuation improvement, are able to be satisfied.

A radio-frequency front-end circuit according to a preferred embodiment of the present invention includes an acoustic wave filter device according to a preferred embodiment of the present invention, and an amplifier circuit connected to the acoustic wave filter device.

Accordingly, it is possible to provide a radio-frequency front-end circuit that is capable of achieving both low loss and high selectivity (prevention of mutual interference with other bands adjacent to its own band).

A communication apparatus according to a preferred embodiment of the present invention includes an RF signal processing circuit that processes a radio-frequency signal transmitted or received by an antenna element, and a radio-frequency front-end circuit according to a preferred embodiment of the present invention that transmits the radio-frequency signal between the antenna element and the RF signal processing circuit.

Accordingly, it is possible to provide a communication apparatus that is capable of achieving both low loss and high selectivity (prevention of mutual interference with other bands adjacent to its own band).

Acoustic wave filter devices, radio-frequency front-end circuits, and communication apparatuses according to preferred embodiments of the present invention are able to achieve low loss within the pass band and improved sharpness on the high-frequency side of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
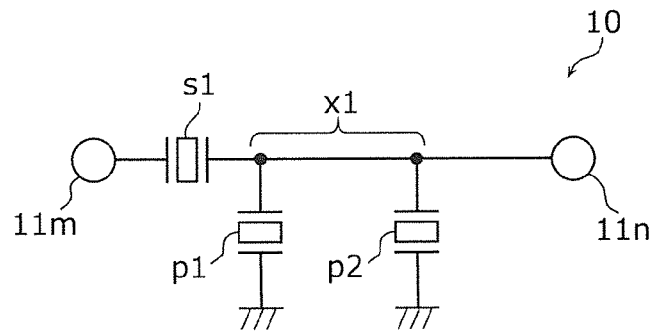
FIG. 1A is a circuit configuration diagram of a filter according to a Preferred Embodiment 1 of the present invention.

Preferred embodiments of the present invention are described in detail with reference to Examples and the drawings. All of the preferred embodiments described below provide general or specific examples. The values, shapes, materials, elements, the arrangements and connection structures of the elements, and other elements and features, which are provided in the following preferred embodiments, are examples and are not intended to limit the present invention. The elements described in the following preferred embodiments are described as optional elements unless they are specified in the independent claims. In addition, the elements illustrated in the drawings are not representative of exact proportions or dimensions. Additionally, in the drawings, the same or substantially the same elements are denoted by the same numerals, and any redundant description will be omitted or may be briefly provided.

Preferred Embodiment 1

FIG. 1A is a circuit configuration diagram of a filter 10 according to a Preferred Embodiment 1 of the present invention.

The filter 10 is preferably a radio frequency filter circuit provided in a front-end portion of a multi-mode/multi-band cellular phone, for example. The filter 10 is preferably a band pass filter included in a multi-band cellular phone complying with a communication standard such as LTE (Long Term Evolution) and configured to filter radio-frequency signals in a predetermined band. The filter 10 is preferably an acoustic wave filter device that filters radio-frequency signals by using acoustic wave resonators.

As illustrated in FIG. 1A, the filter 10 includes a series-arm resonator s1 and parallel-arm resonators p1 and p2.

The series-arm resonator s1 is connected between an input/output terminal 11m(first input/output terminal) and an input/output terminal 11n (second input/output terminal). That is, the series-arm resonator s1 is disposed in a path connecting the input/output terminal 11m and the input/output terminal 11n. The series-arm resonant circuit may be provided with, instead of the series-arm resonator s1, a series-arm resonant circuit including one or more acoustic wave resonators. In the present preferred embodiment, the series-arm resonant circuit includes a single acoustic wave resonator. However, the series-arm resonant circuit may include a plurality of acoustic wave resonators. A series-arm resonant circuit including a plurality of acoustic wave resonators preferably includes, for example, a longitudinally coupled resonator including a plurality of acoustic wave resonators, or a plurality of sub-resonators into which, for example, a single acoustic wave resonator is divided in series. For example, a longitudinally coupled resonator used as a series-arm resonant circuit is able to satisfy required filter characteristics, such as attenuation improvement.

The parallel-arm resonator p1 is a first parallel-arm resonator connected to a node (in FIG. 1A, a node x1) on the path connecting the input/output terminal 11m and the input/output terminal 11n and to ground (reference terminal). That is, the parallel-arm resonator p1 is disposed in a parallel-arm resonant circuit connecting the node x1 on the path and ground.

The parallel-arm resonator p2 is a second parallel-arm resonator connected to a node (in FIG. 1A, the node x1) on the path connecting the input/output terminal 11m and the input/output terminal 11n and to ground (reference terminal). That is, the parallel-arm resonator p2 is disposed in a parallel-arm resonant circuit connecting the node x1 on path and ground.

The parallel-arm resonators p1 and p2 are connected between the same node x1 on the path and ground. In the present preferred embodiment, the parallel-arm resonators p1 and p2 are connected in parallel and are connected between the node x1 and ground. As used here, the term "the same node" is used to include not only a single node on a transmission line but also two different nodes on a transmission line, which are located with no resonator or impedance element therebetween. In the present preferred embodiment, the node x1 is preferably located on the side of the series-arm resonator s1 closer to the input/output terminal 11n. Alternatively, the node x1 may be located on the side of the series-arm resonator s1 closer to the input/output terminal 11m.

Further, the parallel-arm resonators p1 and p2 define a parallel-arm resonant circuit connected between ground and the node x1 on the path (on the series arm) connecting the input/output terminal 11m and the input/output terminal 11n. That is, the parallel-arm resonant circuit is disposed in a single parallel arm connecting a series arm and ground. Thus, a series-arm resonant circuit (in the present preferred embodiment, the series-arm resonator s1) and a parallel-arm resonant circuit (in this embodiment, the parallel-arm resonators p1 and p2) define a ladder filter structure (in the present preferred embodiment, a single-stage ladder filter structure).

That is, the parallel-arm resonant circuit including the parallel-arm resonators p1 and p2, and the series-arm resonator s1 define the pass band of the filter 10.

Next, the structure of the filter 10 will be described.

Figure 1B:
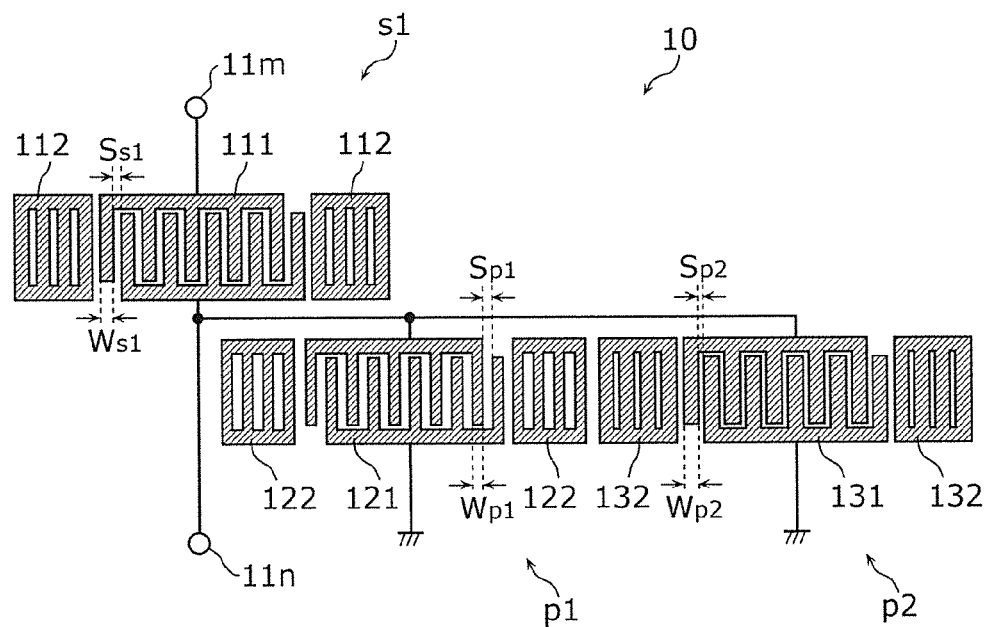
FIG. 1B is a schematic plan view of an electrode structure of the filter according to the Preferred Embodiment 1 of the present invention.

FIG. 1B is a schematic plan view of an electrode structure of the filter 10 according to Preferred Embodiment 1.

As illustrated in FIG. 1B, the resonators included in the filter 10 (the series-arm resonator s1 and the parallel-arm resonators p1 and p2) are each preferably an acoustic wave resonator that uses an acoustic wave. Accordingly, the filter 10 includes IDT (InterDigital Transducer) electrodes on a substrate with piezoelectric properties, and thus a compact, low-profile filter circuit having a bandpass characteristic with high steepness is able to be obtained. The substrate with piezoelectric properties is a substrate, at least a surface of which has piezoelectric properties. The substrate may preferably be, for example, a multilayer body including a piezoelectric thin film on a surface thereof and including a film having a different acoustic velocity from the piezoelectric thin film, a support substrate, and other suitable layers or films. Alternatively, the substrate may be, for example, a multilayer body including a high-acoustic-velocity support substrate and a piezoelectric thin film disposed on the high-acoustic-velocity support substrate, a multilayer body including a high-acoustic-velocity support substrate, a low-acoustic-velocity film disposed on the high-acoustic-velocity support substrate, and a piezoelectric thin film disposed on the low-acoustic-velocity film, or a multilayer body including a support substrate, a high-acoustic-velocity film disposed on the support substrate, a low-acoustic-velocity film disposed on the high-acoustic-velocity film, and a piezoelectric thin film disposed on the low-acoustic-velocity film. The entire substrate may have piezoelectric properties.

Each resonator includes an IDT electrode that excites an acoustic wave, and a pair of reflectors disposed on both sides of the IDT electrode in the acoustic wave propagation direction.

Specifically, the series-arm resonator s1 includes an IDT electrode 111 and a pair of reflectors 112. The parallel-arm resonator p1 includes an IDT electrode 121 and a pair of reflectors 122. The parallel-arm resonator p2 includes an IDT electrode 131 and a pair of reflectors 132.

The resonant frequency of the parallel-arm resonator p2 (second parallel-arm resonator) is higher than the resonant frequency of the parallel-arm resonator p1 (first parallel-arm resonator). The resonant frequency of a resonator is the frequency at a singularity at which the impedance reaches a local minimum (ideally, a point at which the impedance reaches 0). Further, the anti-resonant frequency of the parallel-arm resonator p2 is higher than the anti-resonant frequency of the parallel-arm resonator p1. The anti-resonant frequency of a resonator is the frequency at a singularity at which the impedance reaches a local maximum (ideally, a point at which the impedance becomes infinite). Further, the IDT electrode 131 in the parallel-arm resonator p2 has a higher duty ratio than the IDT electrode 121 in the parallel-arm resonator p1, where the duty ratio is the ratio of the width of a plurality of electrode fingers to the pitch of the plurality of electrode fingers. In the present preferred embodiment, furthermore, the IDT electrode 111 (when the series-arm resonant circuit is a longitudinally coupled resonator, a plurality of IDT electrode) in the series-arm resonator s1 (series-arm resonant circuit) has a higher duty ratio than the IDT electrode 121 in the parallel-arm resonator p1.

As illustrated in FIG. 1B, the width (line width) of a plurality of electrode fingers of the IDT electrode 111 of the series-arm resonator s1 is defined by $W_{s1}$, and the width of the space between adjacent electrode fingers is defined by $S_{s1}$. The width of a plurality of electrode fingers of the IDT electrode 121 of the parallel-arm resonator p1 is defined by $W_{p1}$, and the width of the space between adjacent electrode fingers is defined by $S_{p1}$. The width of the electrode fingers of the IDT electrode 131 of the parallel-arm resonator p2 is denoted by $W_{p2}$, and the width of the space between adjacent electrode fingers is denoted by $S_{p2}$. In this case, the duty ratio of the IDT electrode 131, which is denoted by $W_{p2}/(W_{p2}+S_{p2})$, is higher than the duty ratio of the IDT electrode 121, which is denoted by $W_{p1}/(W_{p1}+S_{p1})$, and the duty ratio of the IDT electrode 111, which is denoted by $W_{s1}/(W_{s1}+S_{s1})$, is higher than the duty ratio of the IDT electrode 121, which is given by $W_{p1}/(W_{p1}+S_{p1})$. That is, the relationship of $W_{p2}/(W_{p2}+S_{p2})>W_{p1}/(W_{p1}+S_{p1})$ and $W_{s1}/(W_{s1}+S_{s1})>W_{p1}/(W_1+S_{p1})$ is preferably satisfied.

In the present preferred embodiment, the IDT electrodes 111, 121, and 131 have the same number of pairs of electrode fingers and the same overlap width. Alternatively, the number of pairs of electrode fingers and the overlap width of at least one IDT electrode may be different from the numbers of pairs of electrode fingers and the overlap widths of the other IDT electrodes.

The following describes the structure of each of the resonators included in the filter 10 in more detail, focusing on a particular one of the resonators. The other resonators have the same or substantially the same structure as the particular resonator and will not be described in detail herein.

Figure 2:
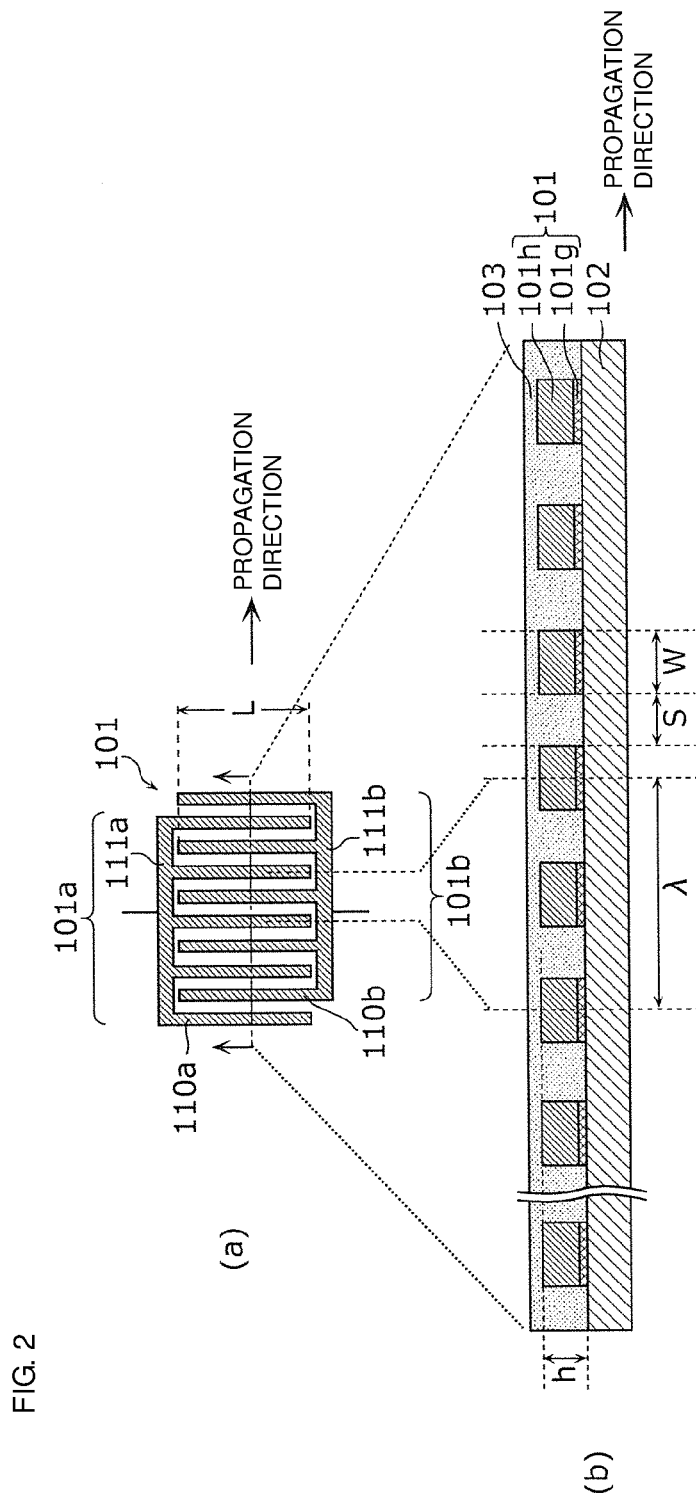
FIG. 2 is an example schematic diagram of the structure of a resonator in the Preferred Embodiment 1 of the present invention.

FIG. 2 is an example schematic diagram of the structure of a resonator in the present preferred embodiment, in which part (a) is a plan view of the resonator and part (b) is a cross-sectional view of the resonator illustrated in part (a). The resonator illustrated in FIG. 2 is for the purpose of illustration of a typical structure of each of the resonators included in the filter 10. For this reason, the number, length, and other parameters of electrode fingers of an IDT electrode of each resonator in the filter 10 are not limited to the number and length of electrode fingers of an IDT electrode illustrated in FIG. 2. In FIG. 2, reflectors included in the resonator are not illustrated.

As illustrated in parts (a) and (b) of FIG. 2, the resonator includes an IDT electrode 101, a piezoelectric substrate 102 including the IDT electrode 101 provided thereon, and a protection layer 103 that covers the IDT electrode 101. These components will be described in detail hereinafter.

As illustrated in part (a) of FIG. 2, a pair of opposing comb electrodes 101a and 101b, which define the IDT electrode 101, are disposed on the piezoelectric substrate 102. The comb electrode 101a includes a plurality of parallel electrode fingers 110a and a busbar electrode 111a that connects the plurality of electrode fingers 110a together. The comb electrode 101b includes a plurality of parallel electrode fingers 110b and a busbar electrode 111b that connects the plurality of electrode fingers 110b together. The pluralities of electrode fingers 110a and 110b extend in a direction perpendicular or substantially perpendicular to the propagation direction.

The comb electrodes 101a and 101b may each be referred to alone as an IDT electrode. In the following description, however, the pair of comb electrodes 101a and 101b define a single IDT electrode 101, for convenience of description.

Further, as illustrated in part (b) of FIG. 2, the IDT electrode 101, which includes the pluralities of electrode fingers 110a and 110b and the busbar electrodes 111a and 111b, preferably has a multilayer structure including a close contact layer 101g and a main electrode layer 101h.

The close contact layer 101g improves the contact between the piezoelectric substrate 102 and the main electrode layer 101h, and is preferably made of, for example, Ti. The close contact layer 101g preferably has a film thickness of, for example, 12 nm.

The main electrode layer 101h is preferably made of, for example, Al containing about 1% of Cu. The main electrode layer 101h preferably has a film thickness of, for example, about 162 nm.

The piezoelectric substrate 102 includes the IDT electrode 101 provided thereon and is preferably made of, for example, LiTaO$_3$ piezoelectric single crystal, LiNbO$_3$ piezoelectric single crystal, KNbO$_3$ piezoelectric single crystal, quartz, or piezoelectric ceramics.

The protection layer 103 covers the comb electrodes 101a and 101b. The protection layer 103 protects the main electrode layer 101h from the outside environment, adjusts the frequency temperature characteristics, and improves humidity resistance, and is a film preferably including, for example, silicon dioxide as a main component.

The structure of each of the resonators included in the filter 10 is not limited to the structure depicted in FIG. 2. For example, the IDT electrode 101 may include a single-layer metal film, rather than having a multilayer structure including metal films. In addition, the materials of the close contact layer 101g, the main electrode layer 101h, and the protection layer 103 are not limited to those described above. Additionally, the IDT electrode 101 may preferably be made of a metal, for example, such as Ti, Al, Cu, Pt, Au, Ag, or Pd, or an alloy, or may include a plurality of multilayer bodies made the metal or alloy. Further, the protection layer 103 is optional.

In a resonator (acoustic wave resonator) having the configuration described above, the design parameters of the IDT electrode 101 define the wavelength of the acoustic wave to be excited. That is, the design parameters of the IDT electrode 101 define the resonant frequency and anti-resonant frequency of the resonator. The following describes the design parameters of the IDT electrode 101, that is, the design parameters of the comb electrode 101a and the comb electrode 101b.

The wavelength of the acoustic wave is defined by a repetition period λ of the plurality of electrode fingers 110a or 110b of the comb electrodes 101a and 101b illustrated in FIG. 2. An electrode pitch (electrode period) is equal or approximately equal to ½ of the repetition period λ and is defined by (W+S), where W denotes the line width of the electrode fingers 110a and 110b of the comb electrodes 101a and 101b, and S denotes the width of the space between one of the electrode fingers 110a and one of the electrode fingers 110b, which are adjacent to each other. Further, as illustrated in part (a) of FIG. 2, an overlap width L of the IDT electrode 101 corresponds to the length of an overlap portion of the electrode fingers 110a of the comb electrode 101a and the electrode fingers 110b of the comb electrode 101b when viewed in the acoustic wave propagation direction. Further, an electrode duty (duty ratio) is the proportion of the line width of the pluralities of electrode fingers 110a and 110b, and corresponds to the ratio of the line width of the pluralities of electrode fingers 110a and 110b to the sum of the line width and the space width of the pluralities of electrode fingers 110a and 110b, which is defined by W/(W+S). Further, the number of pairs of electrode fingers refers to the number of paired electrode fingers 110a and 110b of the comb electrodes 101a and 101b, and is approximately half the total number of electrode fingers 110a and 110b. For example, when the number of pairs of electrode fingers is denoted by N and the total number of electrode fingers 110a and 110b is denoted by M, then M=2N+1 is satisfied. That is, the number of regions between the distal end of one electrode finger of one of the comb electrodes 101a and 101b and the busbar electrode of the other comb electrode, which faces the distal end, is equal or approximately equal to 0.5 pairs. Further, the film thickness of the IDT electrode 101 refers to a thickness h of the pluralities of electrode fingers 110a and 110b.

Next, filter characteristics of the filter 10 according to the present preferred embodiment will be described.

In the following, for convenience of description, for not only a resonator alone but also a circuit including a plurality of resonators, a singularity at which the impedance reaches a local minimum (ideally, a point at which the impedance reaches 0) is referred to as "resonant frequency". Further, a singularity at which the impedance reaches a local maximum (ideally, a point at which the impedance becomes infinite) is referred to as "anti-resonant frequency".

Figure 3:
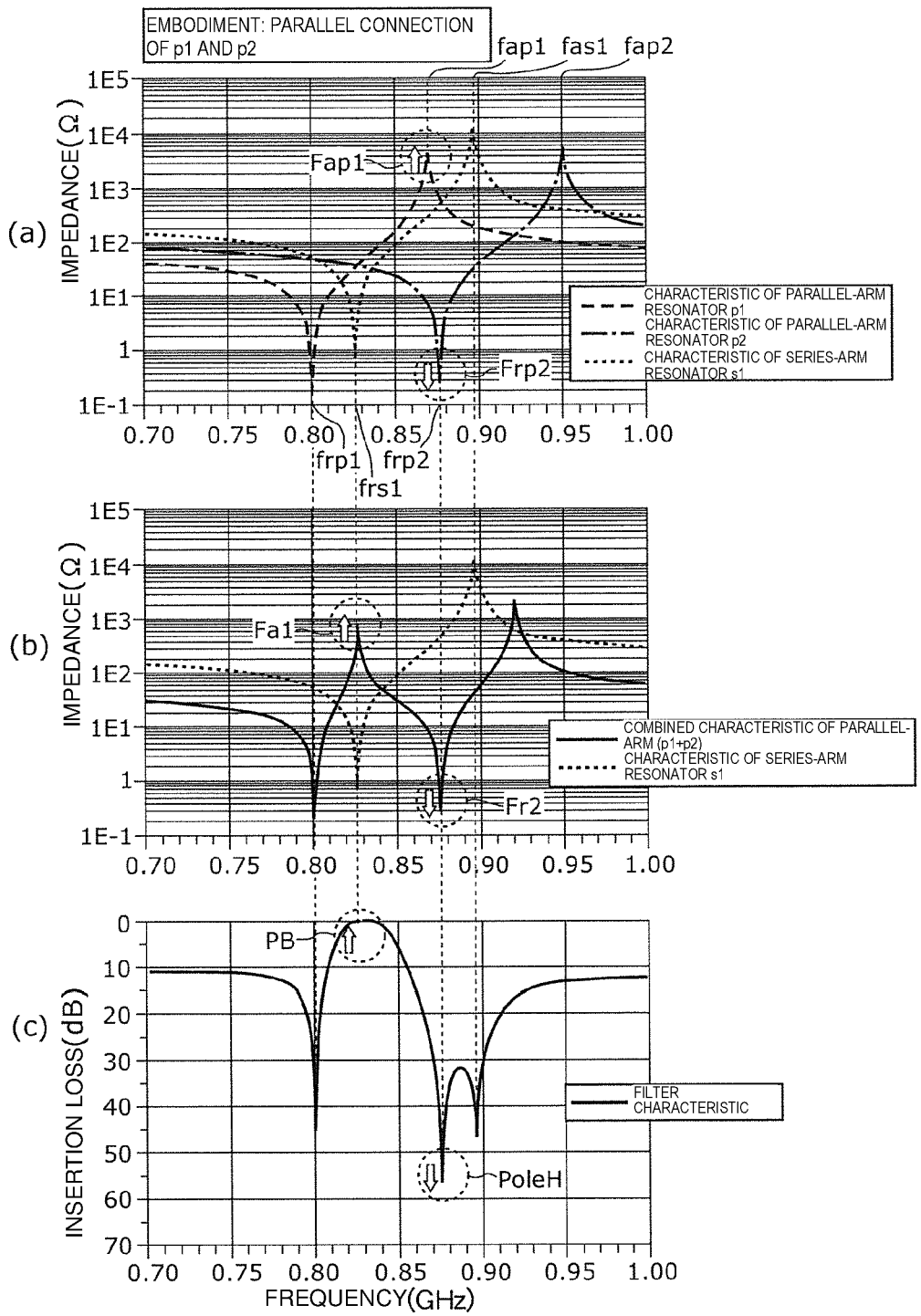
FIG. 3 illustrates graphs depicting characteristics of the filter according to the Preferred Embodiment 1 of the present invention.

FIG. 3 illustrates graphs depicting characteristics of the filter 10 according to the Preferred Embodiment 1. Specifically, part (a) of FIG. 3 is a graph depicting the respective impedance characteristics of the parallel-arm resonators p1 and p2 and the series-arm resonator s1. Part (b) of FIG. 3 is a graph depicting the combined impedance characteristic (combined characteristic) of the parallel-arm resonators p1 and p2 and the impedance characteristic of the series-arm resonator s1. Part (c) of FIG. 3 is a graph depicting a filter characteristic of the filter 10.

First, the impedance characteristics of resonators alone will be described with reference to part (a) of FIG. 3.

As illustrated in FIG. 3, the parallel-arm resonator p1, the parallel-arm resonator p2, and the series-arm resonator s1 have the following impedance characteristics. Specifically, when the parallel-arm resonator p1, the parallel-arm resonator p2, and the series-arm resonator s1 have resonant frequencies frp1, frp2, and frs1 and anti-resonant frequencies fap1, fap2, and fas1, respectively, then in the present preferred embodiment, frp1<frs1<frp2 and fap1<fas1<fap2 are preferably satisfied.

Next, the combined characteristic of the parallel-arm resonator p1 and the parallel-arm resonator p2 (i.e., the impedance characteristic of a parallel-arm resonant circuit) will be described.

As illustrated in part (b) of FIG. 3, the combined characteristic of the two parallel-arm resonators (the parallel-arm resonators p1 and p2) ("combined characteristic of parallel-arm (p1+p2)" in FIG. 3) reaches a local minimum at the resonant frequency frp2 of the parallel-arm resonator p2 and at the resonant frequency frp1 of the parallel-arm resonator p1. Further, the combined characteristic reaches a local maximum at a frequency between the two resonant frequencies frp2 and frp1 and at a frequency between the two anti-resonant frequencies fap2 and fap1.

For a band pass filter including ladder resonators, the lower anti-resonant frequency among the two anti-resonant frequencies of the parallel-arm resonant circuit and the resonant frequency frs1 of the series-arm resonator s1 are set to be close to each other to define a pass band.

Accordingly, as illustrated in part (c) of FIG. 3, an attenuation band including the resonant frequency frp1 of the parallel-arm resonator p1 as an attenuation pole is generated on the low-frequency side of the pass band, and an attenuation band including the resonant frequency frp2 of the parallel-arm resonator p2 and the anti-resonant frequency fas1 of the series-arm resonator s1 as attenuation poles is generated on the high-frequency side of the pass band.

In the combined impedance characteristic of the parallel-arm resonator p1 and the parallel-arm resonator p2, the lower anti-resonant frequency (Fa1 in FIG. 3) and the higher resonant frequency (Fr2 in FIG. 3) define an attenuation slope on the high-frequency side of the pass band of the filter 10. That is, the sharpness of the attenuation slope on the high-frequency side of the pass band is affected by the sharpness of the slope between the lower anti-resonant frequency (Fa1 in FIG. 3) and the higher resonant frequency (Fr2 in FIG. 3) in the combined impedance characteristic. Thus, the Q at the anti-resonant frequency (Fap1 in FIG. 3) of the parallel-arm resonator p1 and the Q at the resonant frequency (Frp2 in FIG. 3) of the parallel-arm resonator p2 affect the sharpness on the high-frequency side of the pass band. Specifically, as the Q at the anti-resonant frequency of the parallel-arm resonator p1 increases, the Q at the lower anti-resonant frequency (Fa1 in FIG. 3) increases in the combined impedance characteristic of a parallel-arm resonant circuit (in the present preferred embodiment, a parallel-connected circuit of the parallel-arm resonators p1 and p2). In contrast, as the Q at the resonant frequency of the parallel-arm resonator p2 increases, the Q at the higher resonant frequency (Fr2 in FIG. 3) increases in the combined impedance characteristic of the parallel-arm circuit. Accordingly, an improvement in the sharpness of the slope between the lower anti-resonant frequency and the higher resonant frequency (between Fa1 and Fr2 in FIG. 3) in the combined impedance characteristic is able to improve the sharpness on the high-frequency side of the pass band in the filter characteristic described above. In other words, the higher the Q at the resonant frequency of the parallel-arm resonator p2, the higher the Q at the attenuation pole (indicated by PoleH in FIG. 3) on the high-frequency side of the pass band becomes (i.e., the deeper the attenuation pole becomes), and the higher the Q at the anti-resonant frequency of the parallel-arm resonator p1, the more the loss within the pass band (indicated by PB in FIG. 3) is reduced. Accordingly, the sharpness on the high-frequency side of the pass band is able to be improved.

Furthermore, near the lower anti-resonant frequency, the combined impedance characteristic of the parallel-arm resonant circuit corresponds to a characteristic obtained by combining the capacitance component of the parallel-arm resonator p2 with the characteristic of the parallel-arm resonator p1. Accordingly, in addition to increasing the Q at the anti-resonant frequency of the parallel-arm resonator p1, increasing the Q of the capacitance component of the parallel-arm resonator p2, that is, reducing the series resistance of the parallel-arm resonator p2, is able to reduce the loss within the pass band of the filter 10.

In the filter 10 according to the present preferred embodiment, as described above, the IDT electrode 131 in the parallel-arm resonator p2 has a higher duty ratio than the IDT electrode 121 in the parallel-arm resonator p1. Accordingly, the filter 10 is able to achieve low loss within the pass band and improved sharpness on the high-frequency side of the pass band. The following describes the reasons for such advantageous effects, together with the circumstances leading to preferred embodiments of the present invention.

In an acoustic wave filter device, generally, due to the restriction of filter characteristics by the Qs of resonators included in the acoustic wave filter device, it is difficult to improve filter characteristics. To address this problem, the inventor of preferred embodiments of the present invention has discovered that the change in the Qs at the resonant frequency and the anti-resonant frequency of a resonator depends on the duty ratio of an IDT electrode of the resonator, which may be utilized to improve filter characteristics. This will be described hereinafter based on a specific typical example.

In a Typical Example 1 described below, frequency bands are different from those in the present preferred embodiment. However, the tendency for the Qs at the resonant frequency and the anti-resonant frequency to change in dependence on the duty ratio of the IDT electrode is similar to that in the frequency bands in the present preferred embodiment. In the Typical Example 1 described below, furthermore, different widths of a plurality of electrode fingers are provided, with the wavelength (repetition period) λ of the acoustic wave to be excited in a resonator (i.e., the pitch of the plurality of electrode fingers) maintained constant, thus providing different duty ratios.

In a resonator, the duty ratio may be changed by changing the width of a plurality of electrode fingers. For example, as the width of the plurality of electrode fingers increases, the electrode finger resistance decreases. That is, the width of the plurality of electrode fingers is increased, thus reducing series resistance, which may cause deterioration of the Q at the resonant frequency of the resonator. That is, the width of a plurality of electrode fingers of an IDT electrode in a resonator is increased, thus increasing the Q at the resonant frequency. On the other hand, a reduction in the width of the plurality of electrode fingers increases insulation resistance, which may cause an increase in Q at the anti-resonant frequency. That is, the width of a plurality of electrode fingers of an IDT electrode of a resonator is reduced, thus increasing the Q at the anti-resonant frequency.

Table 1 shows the details of the design parameters of a resonator in this case. In Table 1, fr represents the resonant frequency, fa represents the anti-resonant frequency, Qr represents the Q at the resonant frequency, and Qa represents the Q at the anti-resonant frequency. Although not provided in Table 1, the film thickness h is the same or substantially the same for all typical examples.

TABLE 1

| Duty Ratio [—] | λ [μm] | fr [MHz] | fa [MHz] | Qr [—] | Qa [—] |
|---|---|---|---|---|---|
| 0.30 (Typical Example 1-1) | 4.233 | 967.5 | 996.0 | 537.0 | 743.0 |
| 0.35 (Typical Example 1-2) | " | 960.5 | 990.0 | 623.0 | 653.0 |
| 0.40 (Typical Example 1-3) | " | 953.5 | 985.0 | 680.0 | 553.0 |
| 0.45 (Typical Example 1-4) | " | 948.0 | 980.0 | 745.0 | 527.0 |
| 0.50 (Typical Example 1-5) | " | 943.0 | 976.0 | 786.0 | 488.0 |
| 0.55 (Typical Example 1-6) | " | 939.0 | 972.5 | 821.0 | 463.0 |
| 0.60 (Typical Example 1-7) | " | 937.0 | 969.5 | 835.0 | 448.0 |
| 0.65 (Typical Example 1-8) | " | 936.0 | 968.0 | 846.0 | 430.0 |
| 0.70 (Typical Example 1-9) | " | 936.0 | 967.0 | 850.0 | 422.0 |

Figure 4:
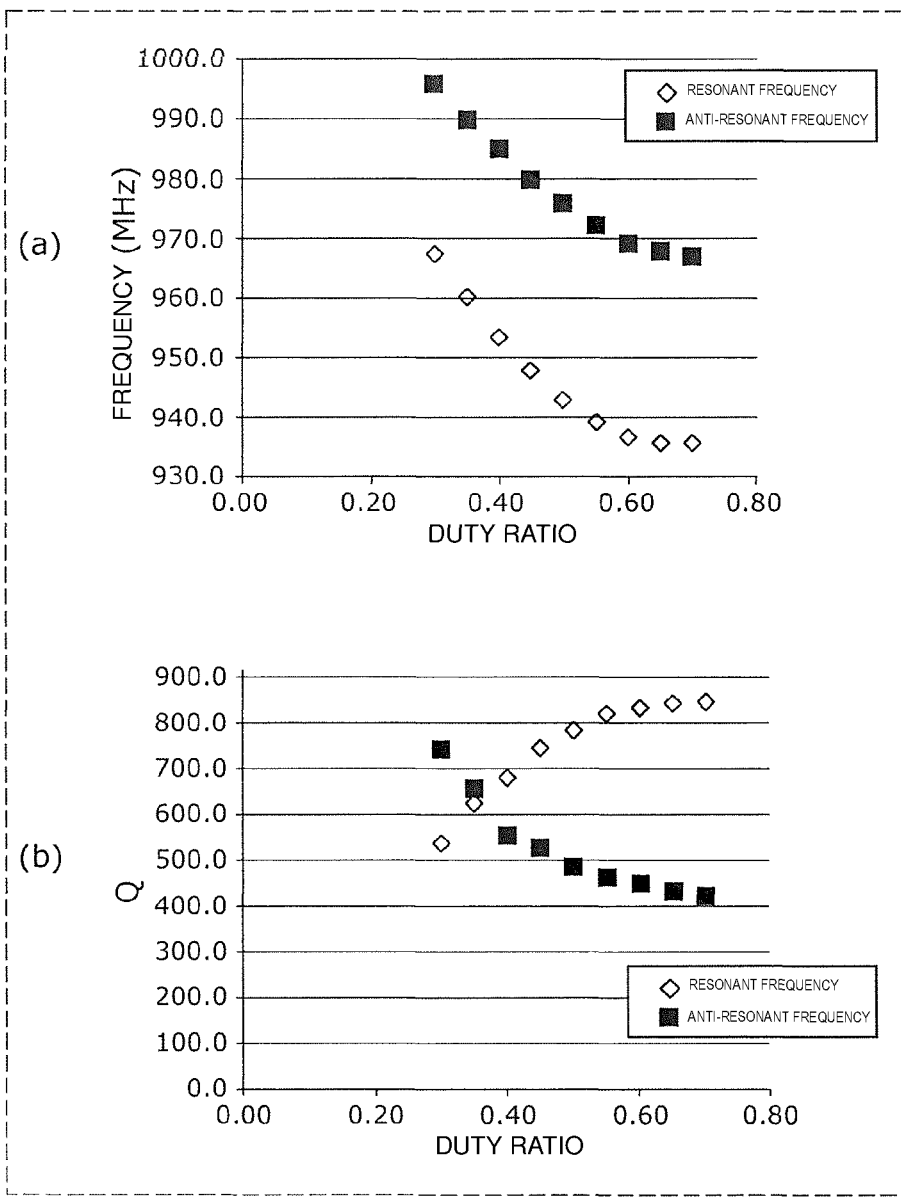
FIG. 4 illustrates graphs depicting changes in resonant frequency and anti-resonant frequency and changes in Q when different duty ratios are used for resonators in a Typical Example 1 of a related art.

Graphs depicting changes in resonant frequency and Q and changes in anti-resonant frequency and Q when different duty ratios are provided as shown in Table 1 are illustrated in FIG. 4. FIG. 4 illustrates graphs depicting changes in resonant frequency and anti-resonant frequency and changes in Q when different duty ratios are used for resonators in Typical Example 1. Part (a) of FIG. 4 is a graph depicting changes in resonant frequency and anti-resonant frequency, and part (b) of FIG. 4 is a graph depicting changes in Q for the resonant frequency and the anti-resonant frequency.

As illustrated in part (b) of FIG. 4, the Q (Qr) at the resonant frequency increases as the duty ratio increases. On the other hand, the Q (Qa) at the anti-resonant frequency increases as the duty ratio decreases.

As illustrated in part (a) of FIG. 4, a change in duty ratio (the width of a plurality of electrode fingers) may cause a fluctuation in the resonant frequency and the anti-resonant frequency. This is because a change in the width of a plurality of electrode fingers changes the acoustic velocity of the acoustic wave to be excited in the resonator. In the Typical Example 1, the pitches of a plurality of electrode fingers are constant. However, changing the pitch of a plurality of electrode fingers may change the resonant frequency and the anti-resonant frequency. For example, the larger the pitch of a plurality of electrode fingers, the lower the resonant frequency and the anti-resonant frequency become. Thus, by adjusting both of the width and pitch of a plurality of electrode fingers, the frequency at which an acoustic wave is excited is able to be set to the desired frequency while the duty ratio is set to the desired duty ratio.

Accordingly, the filter 10 according to the Preferred Embodiment 1 is also able to achieve low loss within the pass band and improved sharpness on the high-frequency side of the pass band by increasing the duty ratio of the IDT electrode 131 included in the parallel-arm resonator p2 and by decreasing the duty ratio of the IDT electrode 121 included in the parallel-arm resonator p1. In this respect, impedance characteristics in response to a change in duty ratio will be described with reference to FIG. 5, focusing on the parallel-arm resonator p2, in particular.

Figure 5:
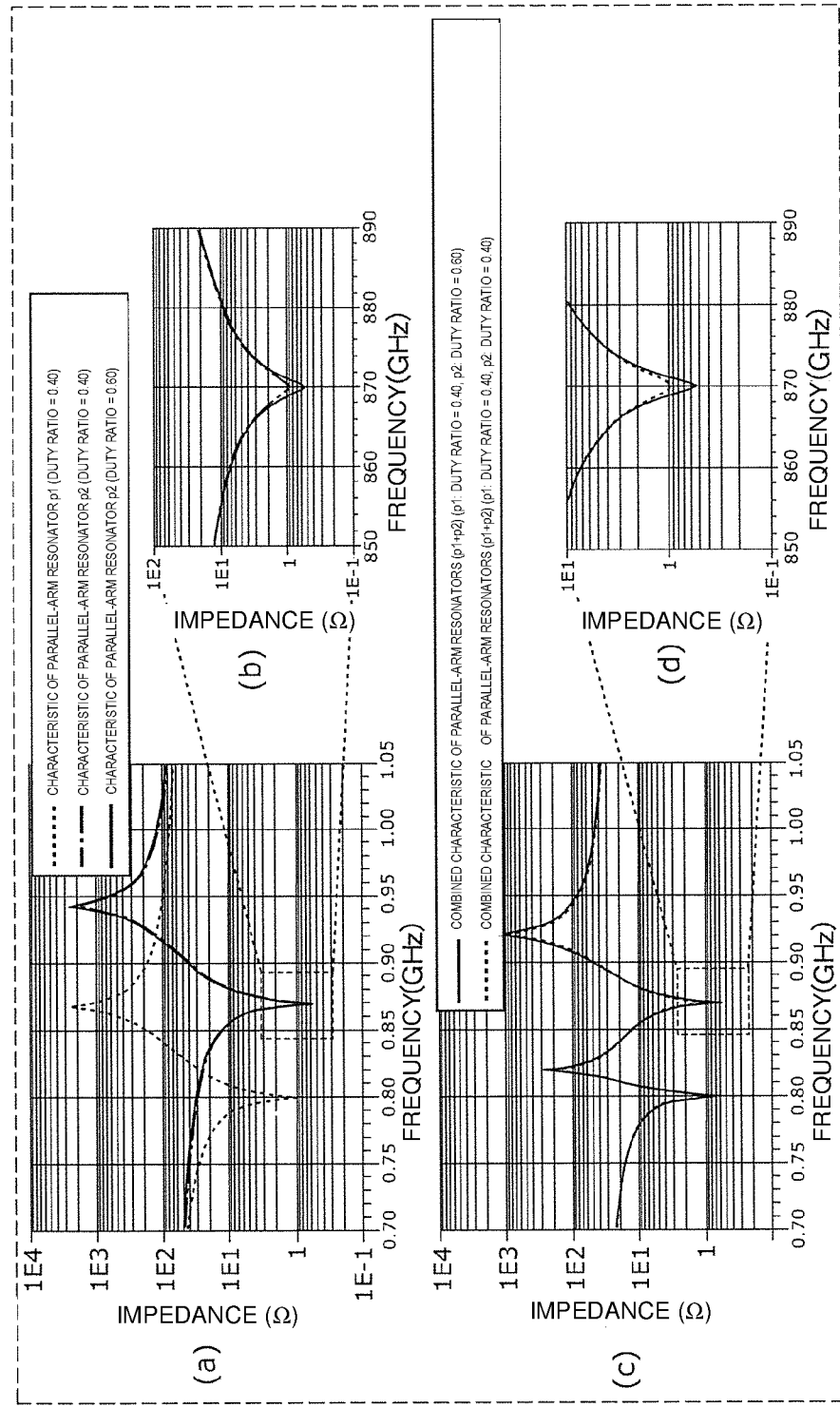
FIG. 5 illustrates graphs depicting impedance characteristics when the duty ratio of a resonator according to the Preferred Embodiment 1 of the present invention is changed.

FIG. 5 illustrates graphs depicting impedance characteristics when the duty ratio of a resonator according to the Preferred Embodiment 1 is changed. In FIG. 5, part (a) is a graph depicting the impedance characteristics of the parallel-arm resonators p1 and p2 whose duty ratios are both about 0.4, and the impedance characteristic of the parallel-arm resonator p2 whose duty ratio is about 0.6, for example, and part (b) is a graph depicting an enlarged view of the impedance characteristic of the parallel-arm resonator p2 around the resonant frequency illustrated in part (a). Part (c) of FIG. 5 is a graph depicting the combined impedance characteristic (combined characteristic) of the parallel-arm resonators p1 and p2 whose duty ratios are both about 0.4, and the combined impedance characteristic (combined characteristic) of the parallel-arm resonators p1 and p2 when the duty ratio of the parallel-arm resonator p2 is about 0.6, for example, and part (d) is a graph depicting an enlarged view of the impedance characteristics around the higher resonant frequency illustrated in part (c).

As illustrated in parts (a) and (b) of FIG. 5, it is discovered that when the duty ratio of the parallel-arm resonator p2 is about 0.6, the Q at the resonant frequency is higher than that when the duty ratio of the parallel-arm resonator p2 is about 0.4. It was also discovered that, as illustrated in parts (c) and (d) of FIG. 5, the Q at the resonant frequency of the parallel-arm resonator p2 is increased, thus increasing the Q at the higher resonant frequency (the resonant frequency corresponding to the parallel-arm resonator p2) in the combined impedance characteristic (combined characteristic) of the parallel-arm resonators p1 and p2.

Although not illustrated in FIG. 5, when the duty ratio is changed with focus on the parallel-arm resonator p1, a reduction in the duty ratio of the parallel-arm resonator p1 results in an increase in Q at the anti-resonant frequency of the parallel-arm resonator p1. Similarly, although not illustrated in FIG. 5, when the duty ratio is changed with focus on the series-arm resonator s1, an increase in the duty ratio of the series-arm resonator s1 results in an increase in Q at the resonant frequency of the series-arm resonator s1.

Next, advantageous effects achieved by the filter 10 according to the present preferred embodiment will be described with reference to an Example of a preferred embodiment of the present invention in comparison with a Comparative Example.

A filter of the Example has a configuration similar to that of the filter 10 according to the preferred embodiment described above. In contrast, a filter of the Comparative Example has substantially the same configuration as that of the filter of the Example, except that the parallel-arm resonator p1 and the parallel-arm resonator p2 including IDT electrodes having the same or substantially the same duty ratio.

Table 2 shows design parameter (duty ratios) of the filters of the Example and the Comparative Example.

TABLE 2

| | Duty Ratio | | |
|---|---|---|---|
| | Series-Arm Resonator s1 | Parallel-Arm Resonator p1 | Parallel-Arm Resonators p2 |
| Example | 0.550 | 0.400 | 0.600 |
| Comparative Example | 0.550 | 0.550 | 0.550 |

As shown in Table 2, the series-arm resonator s1 and the parallel-arm resonators p1 and p2 of the Comparative Example include IDT electrodes having the same or substantially the same duty ratio. The parallel-arm resonator p1 of the Example includes an IDT electrode having a lower duty ratio than that in the parallel-arm resonator p1 of the Comparative Example. The parallel-arm resonator p2 of the Example includes an IDT electrode having a higher duty ratio than that in the parallel-arm resonator p2 of the Comparative Example. That is, in the Example, the parallel-arm resonator p2 includes an IDT electrode having a higher duty ratio than that in the parallel-arm resonator p1. Further, the series-arm resonator s1 of the Example includes an IDT electrode having the same or substantially the same duty ratio as that in the series-arm resonator s1 of the Comparative Example. That is, in the Example, the series-arm resonator s1 includes an IDT electrode having a higher duty ratio than that in the parallel-arm resonator p1.

Figure 6:
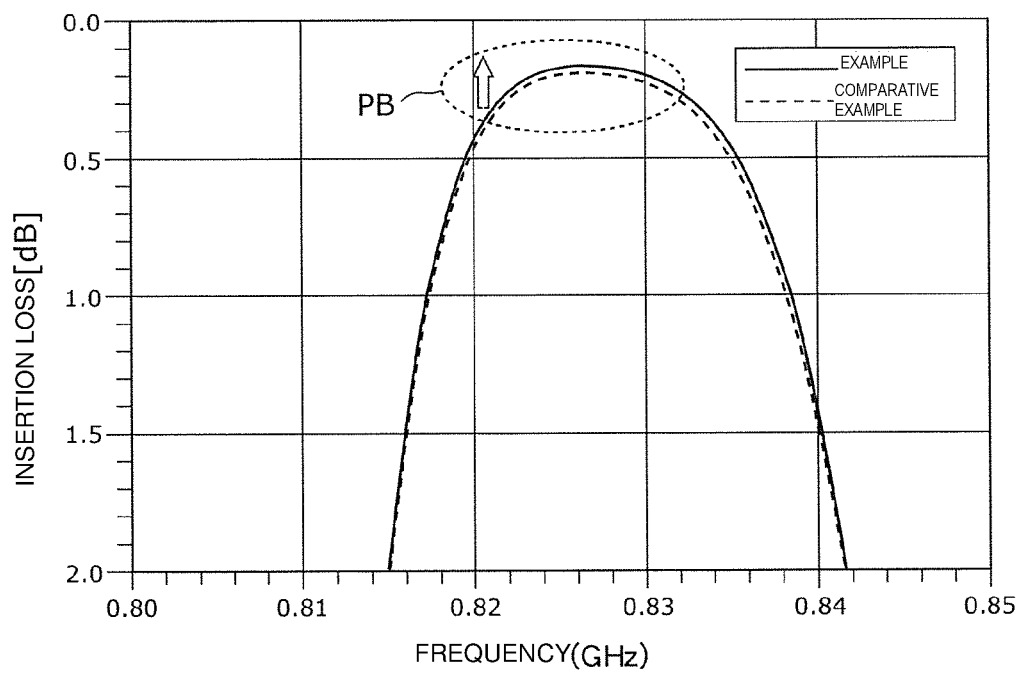
FIG. 6 is a graph depicting filter characteristics of filters of an Example of a preferred embodiment of the present invention and a Comparative Example.

FIG. 6 is a graph illustrating filter characteristics of filters of the Example and the Comparative Example.

For the filter characteristics illustrated in FIG. 6, focusing on the pass band (portion PB in FIG. 6), it is discovered that the loss within the pass band is reduced in the Example, compared with the Comparative Example. That is, in the Example, lower loss within the pass band is achieved than in the Comparative Example.

For the filter characteristics illustrated in FIG. 6, furthermore, focusing on the attenuation slopes on the high-frequency side of the pass band, it was discovered that the steepness of the attenuation slope is improved in the Example, compared with the Comparative Example. That is, in the Example, the sharpness on the high-frequency side of the pass band is improved compared with the Comparative Example.

As described above, in the filter 10 (acoustic wave filter device) according to the present preferred embodiment, the resonant frequency of the parallel-arm resonator p2 (second parallel-arm resonator) is higher than the resonant frequency of the parallel-arm resonator p1 (first parallel-arm resonator), and the anti-resonant frequency of the parallel-arm resonator p2 is higher than the anti-resonant frequency of the parallel-arm resonator p1. In addition, the IDT electrode 131 in the parallel-arm resonator p2 has a higher duty ratio than the IDT electrode 121 in the parallel-arm resonator p1. As a result of intensive research, the inventor of preferred embodiments of the present invention made the following discoveries. For impedance characteristics of a resonator alone, the higher the duty ratio of an IDT electrode, the higher the Q at the resonant frequency becomes. Conversely, the lower the duty ratio of an IDT electrode, the higher the Q at the anti-resonant frequency becomes. For filter characteristics, as the Q at the resonant frequency of the parallel-arm resonator p2 and the Q at the anti-resonant frequency of the parallel-arm resonator p1 increases, a lower loss within the pass band is able to be achieved and the sharpness on the high-frequency side of the pass band is able to be improved. Accordingly, setting the duty ratio of the IDT electrode 131 included in the parallel-arm resonator p2 to be higher than the duty ratio of the IDT electrode 121 included in the parallel-arm resonator p1 achieves low loss within the pass band and improved sharpness on the high-frequency side of the pass band.

In the filter 10 according to the present preferred embodiment, furthermore, the IDT electrode 111 in the series-arm resonator s1 (series-arm resonant circuit) has a higher duty ratio than the IDT electrode 121 in the parallel-arm resonator p1.

The pass band of the filter 10 is defined by the resonant frequency of the series-arm resonator s1 and the lower anti-resonant frequency of a parallel-arm resonant circuit (in the present preferred embodiment, a parallel-connected circuit of the parallel-arm resonators p1 and p2). As described above, for impedance characteristics of a resonator alone, the higher the duty ratio of an IDT electrode, the higher the Q at the resonant frequency becomes. Conversely, the lower the duty ratio of an IDT electrode, the higher the Q at the anti-resonant frequency becomes. Accordingly, an increase in the duty ratio of the IDT electrode 111 included in the series-arm resonator s1 achieves lower loss within the pass band.

In the preferred embodiment described above, the parallel-arm resonators p1 and p2 are connected in parallel and are connected to the same node x1 (node) on a series arm. However, the parallel-arm resonators p1 and p2 may be connected in series with each other and may be connected to the same node x1 (node) on a series arm. Accordingly, such a filter according to a modification of Preferred Embodiment 1 will be described.

Figure 7A:
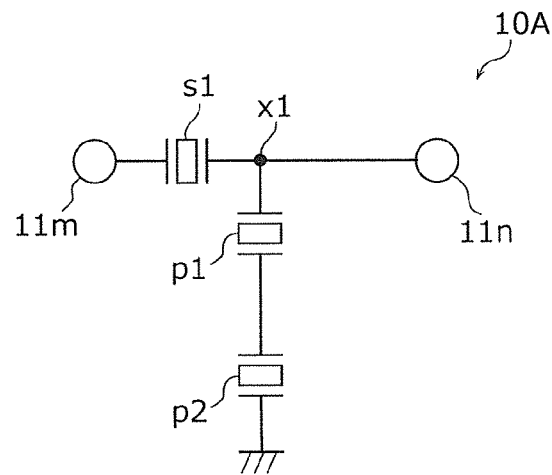
FIG. 7A is a circuit configuration diagram of a filter according to a modification of the Preferred Embodiment 1 of the present invention.
Figure 7B:
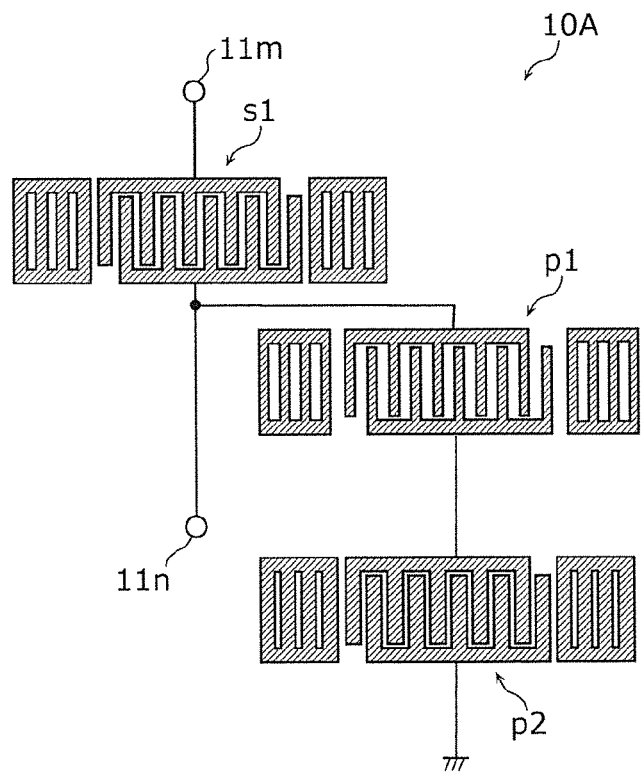
FIG. 7B is a schematic plan view of an electrode structure of the filter according to the modification of the Preferred Embodiment 1 of the present invention.

FIG. 7A is a circuit configuration diagram of a filter 10A according to a modification of Preferred Embodiment 1. FIG. 7B is a schematic plan view of an electrode structure of the filter 10A according to the modification of Preferred Embodiment 1.

In the filter 10A illustrated in FIGS. 7A and 7B, unlike the filter 10 illustrated in FIGS. 1A and 1B, the parallel-arm resonators p1 and p2 are connected between ground and the same node x1 on a path connecting the input/output terminal 11m (first input/output terminal) and the input/output terminal 11n (second input/output terminal) so as to be connected in series with each other. In the present modification, the parallel-arm resonator p1 includes a terminal connected to the node x1 and another terminal connected to one terminal of the parallel-arm resonator p2. The parallel-arm resonator p2 includes a terminal connected to the other terminal of the parallel-arm resonator p1 and another terminal connected to ground. The order in which the parallel-arm resonators p1 and p2 are connected is not limited to that described above and may be reverse.

Figure 8:
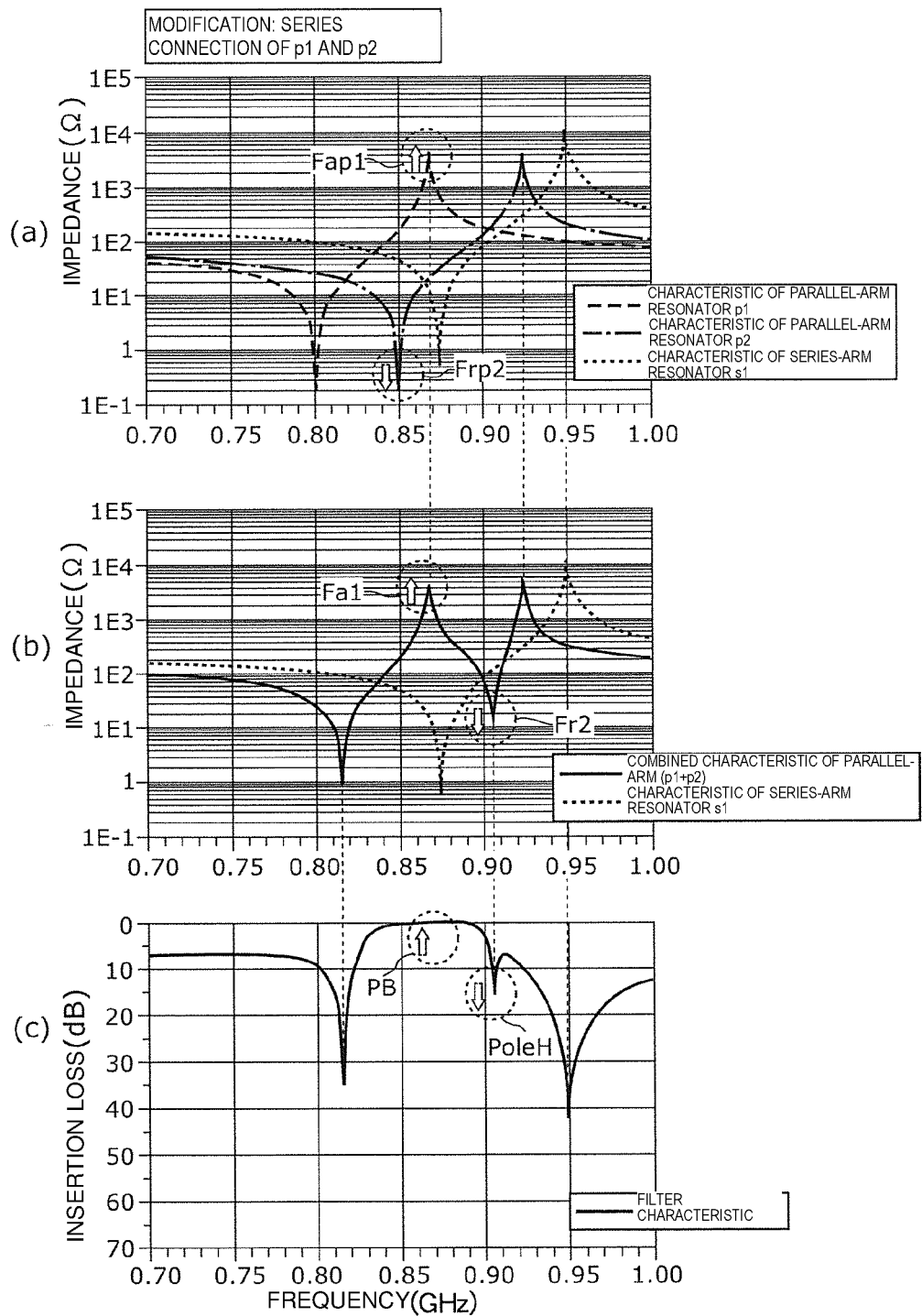
FIG. 8 illustrates graphs depicting characteristics of the filter according to the modification of the Preferred Embodiment 1 of the present invention.

FIG. 8 illustrates graphs depicting characteristics of the filter 10A according to the modification of Preferred Embodiment 1.

Also for the characteristics of the filter 10A according to the present modification, as for the characteristics of the filter 10 according to Preferred Embodiment 1, the Q at the anti-resonant frequency (Fap1 in FIG. 8) of the parallel-arm resonator p1 and the Q at the resonant frequency (Frp2 in FIG. 8) of the parallel-arm resonator p2 affect the sharpness on the high-frequency side of the pass band. A specific mechanism for this is similar to that in Preferred Embodiment 1 and thus will not be described in detail herein.

Further, also for the filter 10A according to the present modification, near the lower anti-resonant frequency, the combined impedance characteristic of a parallel-arm circuit corresponds to a characteristic obtained by combining the capacitance component of the parallel-arm resonator p2 with the characteristic of the parallel-arm resonator p1. Accordingly, in addition to increasing the Q at the anti-resonant frequency of the parallel-arm resonator p1, increasing the Q of the capacitance component of the parallel-arm resonator p2, that is, reducing the series resistance of the parallel-arm resonator p2, is able to reduce the loss within the pass band of the filter 10A.

Accordingly, even with the filter 10A according to the present modification, in which the parallel-arm resonator p2 includes an IDT electrode having a higher duty ratio than that in the parallel-arm resonator p1, as in the Preferred Embodiment 1, low loss and improved sharpness on the high-frequency side of the pass band is able to be achieved.

Preferred Embodiment 2

The configurations of the filters (acoustic wave filter devices) according to the Preferred Embodiment 1 and its modification are applicable to a tunable filter whose pass band is variable. Accordingly, such a tunable filter according to Preferred Embodiment 2 will be described with reference to Application Examples 1 to 5. Specifically, Application Examples 1 to 4 are application examples of the filter 10 according to the Preferred Embodiment 1 to a tunable filter, and Application Example 5 is an application example of the filter 10A according to the modification of Preferred Embodiment 1 to a tunable filter.

The tunable filters in Application Examples 1 to 5 described below each include a switch element connected in series with or parallel to the parallel-arm resonator p1 or the parallel-arm resonator p2, and each have a pass band switched in accordance with the connection (ON) or disconnection (OFF) of the switch element. The switch element is turned on or off in accordance with a control signal from a control unit, such as an RF signal processing circuit (RFIC: Radio Frequency Integrated Circuit), for example.

Application Example 1

Figure 9A:
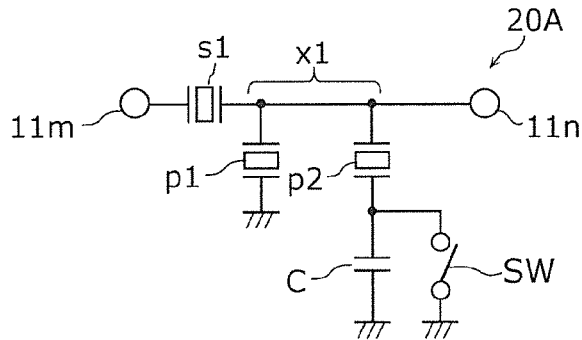
FIG. 9A is a circuit configuration diagram of a filter in an Application Example 1 of a Preferred Embodiment 2 of the present invention.

FIG. 9A is a circuit configuration diagram of a filter 20A in an Application Example 1 of the Preferred Embodiment 2.

Unlike the filter 10 illustrated in FIG. 1A, the filter 20A illustrated in FIG. 9A further includes a capacitor C and a switch SW that are connected in parallel and that are connected in series with at least one of the parallel-arm resonators p1 and p2 (first parallel-arm resonator and second parallel-arm resonator) (in the present application example, the parallel-arm resonator p2). This configuration enables the filter 20A to switch between a first bandpass characteristic and a second bandpass characteristic in accordance with the connection or disconnection of the switch SW. Specifically, in the present application example, the capacitor C and the switch SW, which are connected in parallel, are connected in series with only the parallel-arm resonator p2 out of the parallel-arm resonators p1 and p2.

That is, in the present application example, a circuit including the capacitor C and the switch SW connected in parallel is connected in series with the parallel-arm resonator p2 between the node x1 and ground, and, specifically, is connected in series between ground and the parallel-arm resonator p2. The capacitor C and the switch SW may be connected between the node x1 and the parallel-arm resonator p2.

In the present preferred embodiment, the capacitor C is an impedance element connected in series with the parallel-arm resonator p2. The frequency variable width of the pass band of the filter 20A depends on the constant of the capacitor C. For example, the frequency variable width increases as the constant of the capacitor C decreases. Thus, the constant of the capacitor C may be determined, as desired, in accordance with the frequency specifications required for the filter 20A. Further, the capacitor C may preferably be a variable capacitor such as, for example, a varicap or a DTC (Digital Tunable Capacitor). Accordingly, the frequency variable width is able to be finely adjusted.

The switch SW is preferably, for example, an SPST (Single Pole Single Throw) switch element including a terminal connected to a connection node between the parallel-arm resonator p2 and the capacitor C and another terminal connected to ground. The switch SW is switched between connection (ON) and disconnection (OFF) in accordance with a control signal from the control unit (not illustrated), thus establishing connection or disconnection between the connection node and ground.

Examples of the switch SW include a GaAs or CMOS (Complementary Metal Oxide Semiconductor) FET (Field Effect Transistor) switch and a diode switch, for example. Accordingly, the switch SW may be defined by a single FET switch or diode switch, and thus the filter 20A is able to be reduced in size.

The parallel-arm resonators p1 and p2, the capacitor C, and the switch SW define a parallel-arm resonant circuit connected between ground and the node x1 on the path (on the series arm) connecting the input/output terminal 11m and the input/output terminal 11n. That is, the parallel-arm resonant circuit is disposed in a single parallel arm connecting the series arm and ground. Thus, the filter 20A has a single-stage ladder filter structure including the series-arm resonator s1 and the parallel-arm resonant circuit.

In the parallel-arm resonant circuit, both of the frequency at which the impedance reaches a local minimum and the frequency at which the impedance reaches a local maximum are shifted to lower ranges or higher ranges in accordance with the ON (connection) or OFF (disconnection) of the switch SW. This will be described below together with the characteristics of the filter 20A.

Figure 9B:
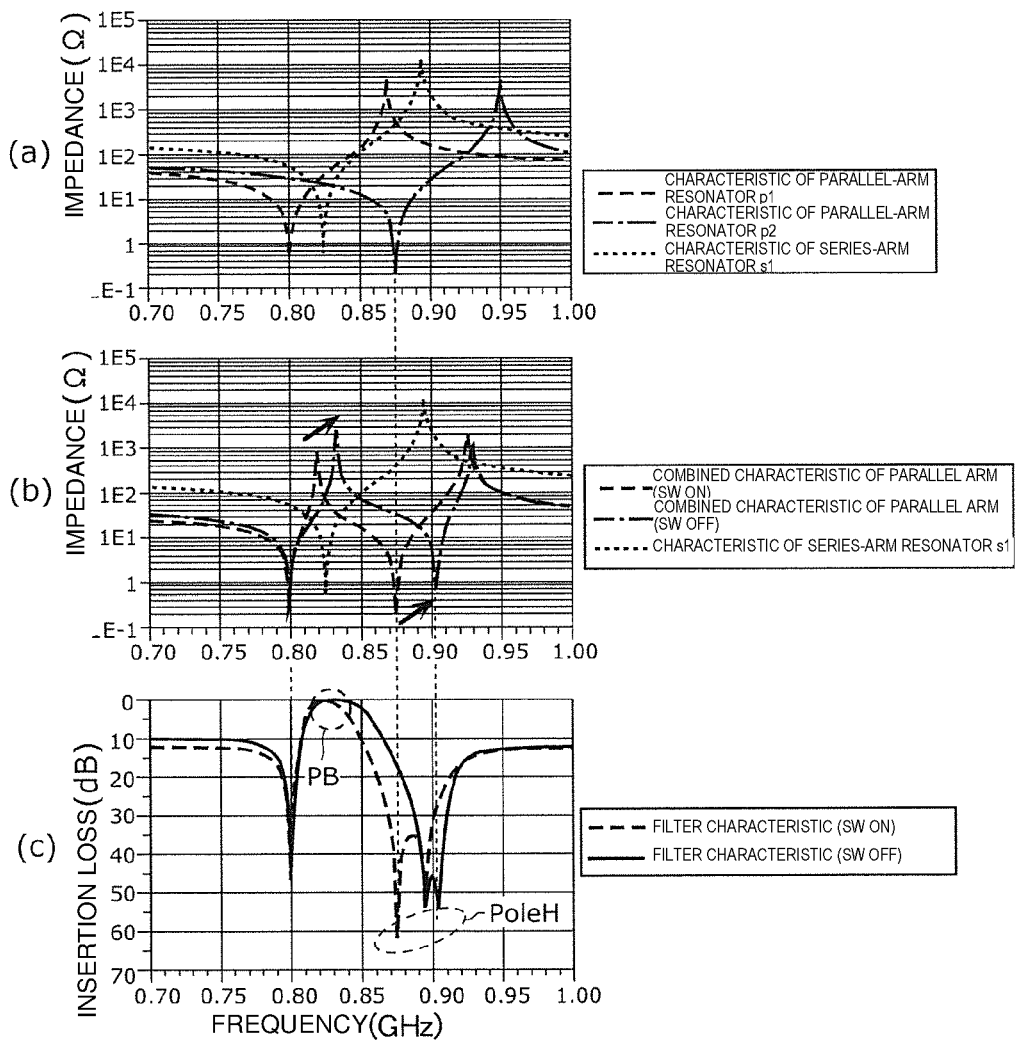
FIG. 9B illustrates graphs depicting characteristics of the filter in the Application Example 1 of the Preferred Embodiment 2 of the present invention.

FIG. 9B illustrates graphs depicting characteristics of the filter 20A in the Application Example 1 of the Preferred Embodiment 2. Specifically, part (a) of FIG. 9B is a graph depicting the impedance characteristics of resonators alone (the parallel-arm resonators p1 and p2 and the series-arm resonator s1). Part (b) of FIG. 9B is a graph depicting a comparison of the combined impedance characteristics (combined characteristics) of a parallel-arm resonant circuit (in the present application example, a circuit defined by the parallel-arm resonators p1 and p2, the capacitor C, and the switch SW) during on/off periods of the switch SW. In FIG. 9B, the impedance characteristic of the series-arm resonator s1 is also illustrated. Part (c) of FIG. 9B is a graph depicting a comparison of filter characteristics during on/off periods of the switch SW.

The impedance characteristics of resonators (the parallel-arm resonator p1, the parallel-arm resonator p2, and the series-arm resonator s1) alone and the characteristic during the on period of the switch SW are similar to those in the Preferred Embodiment 1 described above. Thus, these will be described in a simplified manner, as appropriate, hereinafter.

That is, when the switch SW is on, the filter 20A has a first bandpass characteristic in which a pass band is defined by the lower anti-resonant frequency among the two anti-resonant frequencies of the parallel-arm resonant circuit and by the resonant frequency frs1 of the series-arm resonator s1, a pole (attenuation pole) on the low-frequency side of the pass band is defined by the resonant frequency frp1 of the parallel-arm resonator p1, and a pole (attenuation pole) on the high-frequency side of the pass band is defined by the resonant frequency frp2 of the parallel-arm resonator p2 and the anti-resonant frequency fas1 of the series-arm resonator s1.

When the switch SW is off, on the other hand, the impedance characteristic of the parallel-arm resonant circuit is a characteristic that is affected by the capacitor C. That is, in this state, the combined characteristic of the two parallel-arm resonators (the parallel-arm resonators p1 and p2) and the capacitor C corresponds to the impedance characteristic of the parallel-arm resonant circuit.

In the present application example, the capacitor C is only added to the parallel-arm resonator p2 during the off period of the switch SW. Thus, as indicated by solid black arrows in part (b) of FIG. 9B, when the switch SW is switched from on to off, in the impedance characteristic of the parallel-arm resonant circuit ("combined characteristic of parallel arm" in FIG. 9B), the higher resonant frequency of the two resonant frequencies and the lower anti-resonant frequency of the two anti-resonant frequencies are both shifted to higher ranges.

The lower anti-resonant frequency and the higher resonant frequency of the parallel-arm resonant circuit define an attenuation slope on the high-frequency side of the pass band of the filter 20A. Accordingly, as illustrated in part (c) of FIG. 9B, the switch SW is switched from on to off, thus switching the bandpass characteristic of the filter 20A from the first bandpass characteristic to a second bandpass characteristic in which the attenuation slope on the high-frequency side of the pass band is shifted to a higher range with its steepness maintained. In other words, the filter 20A is able to switch the attenuation pole frequency on the high-frequency side of the pass band in accordance with switching between the connection and disconnection of the switch SW, and is able to reduce or prevent the increase in insertion loss at the high-frequency end of the pass band.

Even with the filter 20A having the configuration described above, in which the IDT electrode in the parallel-arm resonator p2 has a higher duty ratio than the IDT electrode in the parallel-arm resonator p1, as in the Preferred Embodiment 1, for each of the first bandpass characteristic and the second bandpass characteristic, low loss and improved sharpness on the high-frequency side of the pass band are able to be achieved. That is, the filter 20A defines a tunable filter that is able to achieve low loss and improved sharpness on the high-frequency side of the pass band.

The impedance element is not limited to a capacitor and may be an inductor, for example. When an inductor is used as an impedance element, the direction in which an attenuation slope is shifted in response to the on/off of the switch SW is different than that in the configuration described above. Specifically, in the second bandpass characteristic during the off period of the switch SW, an attenuation slope is shifted to a lower range, compared with the first bandpass characteristic during the on period of the switch SW. At this time, the frequency variable width of the pass band of the filter 20A depends on the constant of the inductor. For example, the frequency variable width increases as the constant of the inductor increases. Thus, the constant of the inductor may be determined, as desired, in accordance with the frequency specifications required for the filter 20A. In this case, the inductor may preferably be a MEMS (Micro Electro Mechanical Systems) variable inductor, for example. Accordingly, the frequency variable width is able to be finely adjusted.

Application Example 2

Figure 10A:
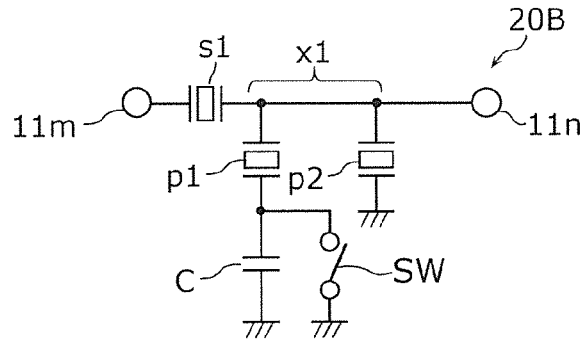
FIG. 10A is a circuit configuration diagram of a filter in an Application Example 2 of the Preferred Embodiment 2 of the present invention.

FIG. 10A is a circuit configuration diagram of a filter 20B in an Application Example 2 of the Preferred Embodiment 2.

In the filter 20B illustrated in FIG. 10A, unlike the filter 20A illustrated in FIG. 9A, the capacitor C and the switch SW, which are connected in parallel, are connected in series with only the parallel-arm resonator p1 of the parallel-arm resonators p1 and p2.

Figure 10B:
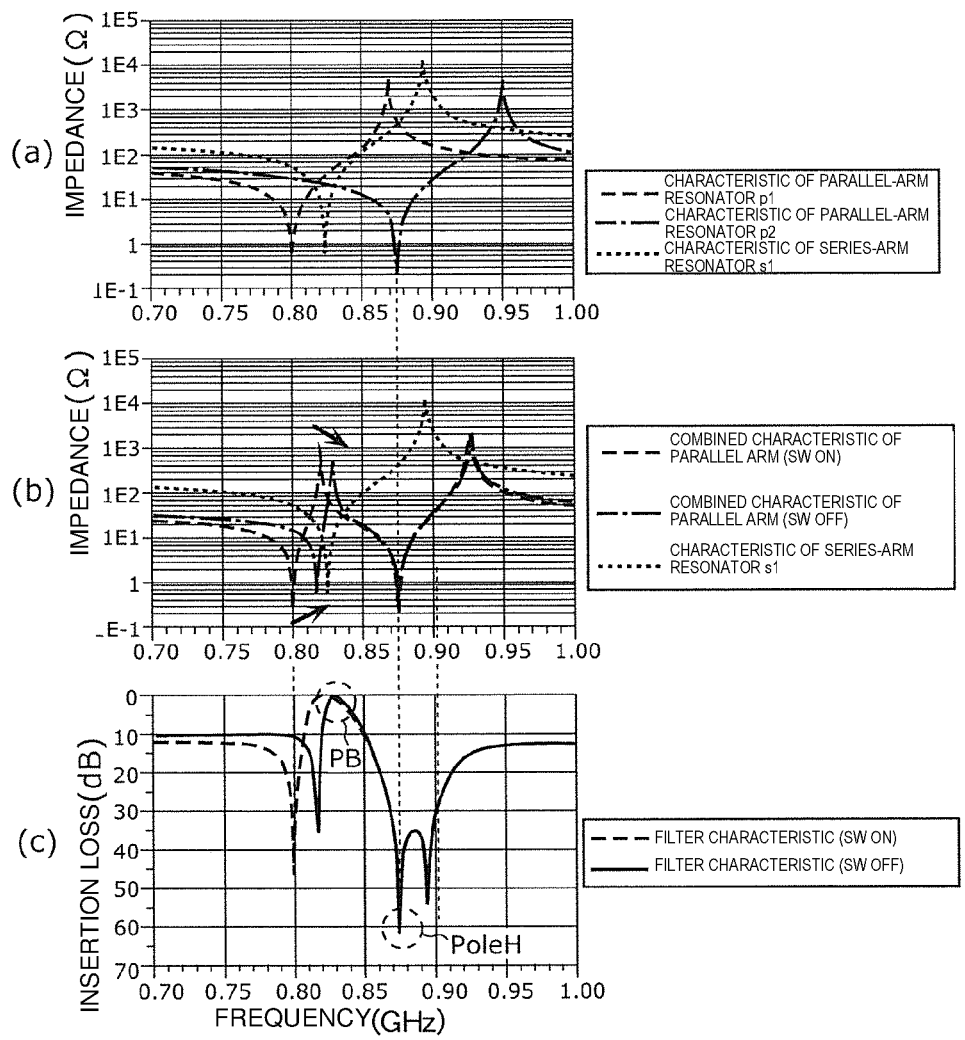
FIG. 10B illustrates graphs depicting characteristics of the filter in the Application Example 2 of the Preferred Embodiment 2 of the present invention.

FIG. 10B illustrates graphs depicting characteristics of the filter 20B in the Application Example 2 of the Preferred Embodiment 2. Specifically, as in parts (a) and (b) of FIG. 9B, parts (a) and (b) of FIG. 10B are graphs depicting the impedance characteristics of resonators alone and combined impedance characteristics of a parallel-arm resonant circuit. Part (c) of FIG. 10B is a graph depicting a comparison of filter characteristics during on/off periods of the switch SW.

In the present application example, the capacitor C is only added to the parallel-arm resonator p1 during the off period of the switch SW. Thus, as indicated by solid black arrows in part (b) of FIG. 10B, when the switch SW is switched from on to off, in the impedance characteristic of the parallel-arm resonant circuit ("combined characteristic of parallel arm" in FIG. 10B), the lower resonant frequency of the two resonant frequencies and the lower anti-resonant frequency of the two anti-resonant frequencies are both shifted to higher ranges.

The lower anti-resonant frequency and the lower resonant frequency of the parallel-arm resonant circuit define an attenuation slope on the low-frequency side of the pass band of the filter 20B. Accordingly, as illustrated in part (c) of FIG. 10B, the switch SW is switched from on to off, thus switching the bandpass characteristic of the filter 20B from the first bandpass characteristic to a second bandpass characteristic in which the attenuation slope on the low-frequency side of the pass band is shifted to a higher range with its steepness maintained. In other words, the filter 20B is able to switch the attenuation pole frequency on the low-frequency side of the pass band in accordance with switching between the connection and disconnection of the switch SW, and is able to reduce or prevent the increase in insertion loss at the low-frequency end of the pass band.

Even with the filter 20B having the configuration described above, in which the IDT electrode in the parallel-arm resonator p2 has a higher duty ratio than the IDT electrode in the parallel-arm resonator p1, as in Preferred Embodiment 1, for each of the first bandpass characteristic and the second bandpass characteristic, low loss and improved sharpness on the high-frequency side of the pass band are able to be achieved. That is, the filter 20B defines a tunable filter that is able to achieve low loss and improved sharpness on the high-frequency side of the pass band.

Application Example 3

Figure 11A:
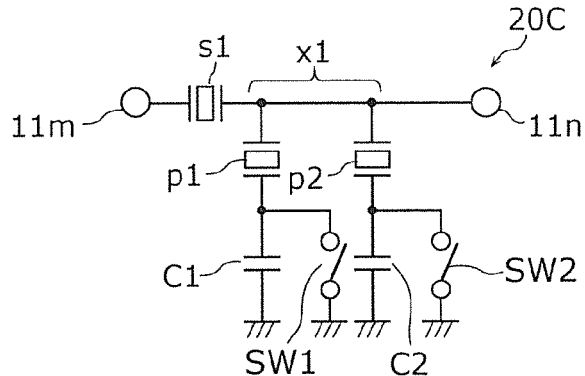
FIG. 11A is a circuit configuration diagram of a filter in an Application Example 3 of the Preferred Embodiment 2 of the present invention.

FIG. 11A is a circuit configuration diagram of a filter 20C in an Application Example 3 of the Preferred Embodiment 2.

In the filter 20C illustrated in FIG. 11A, the attenuation slopes on the high-frequency side of the pass band and the low-frequency side of the pass band are both shifted. Specifically, the filter 20C includes a capacitor C1 and a switch SW1, which correspond to the capacitor C (impedance element) and the switch SW included in the filter 20B illustrated in FIG. 10A. The filter 20C further includes a capacitor C2 and a switch SW2, which correspond to the capacitor C (impedance element) and the switch SW in the pair (another pair) included in the filter 20A illustrated in FIG. 9A.

Figure 11B:
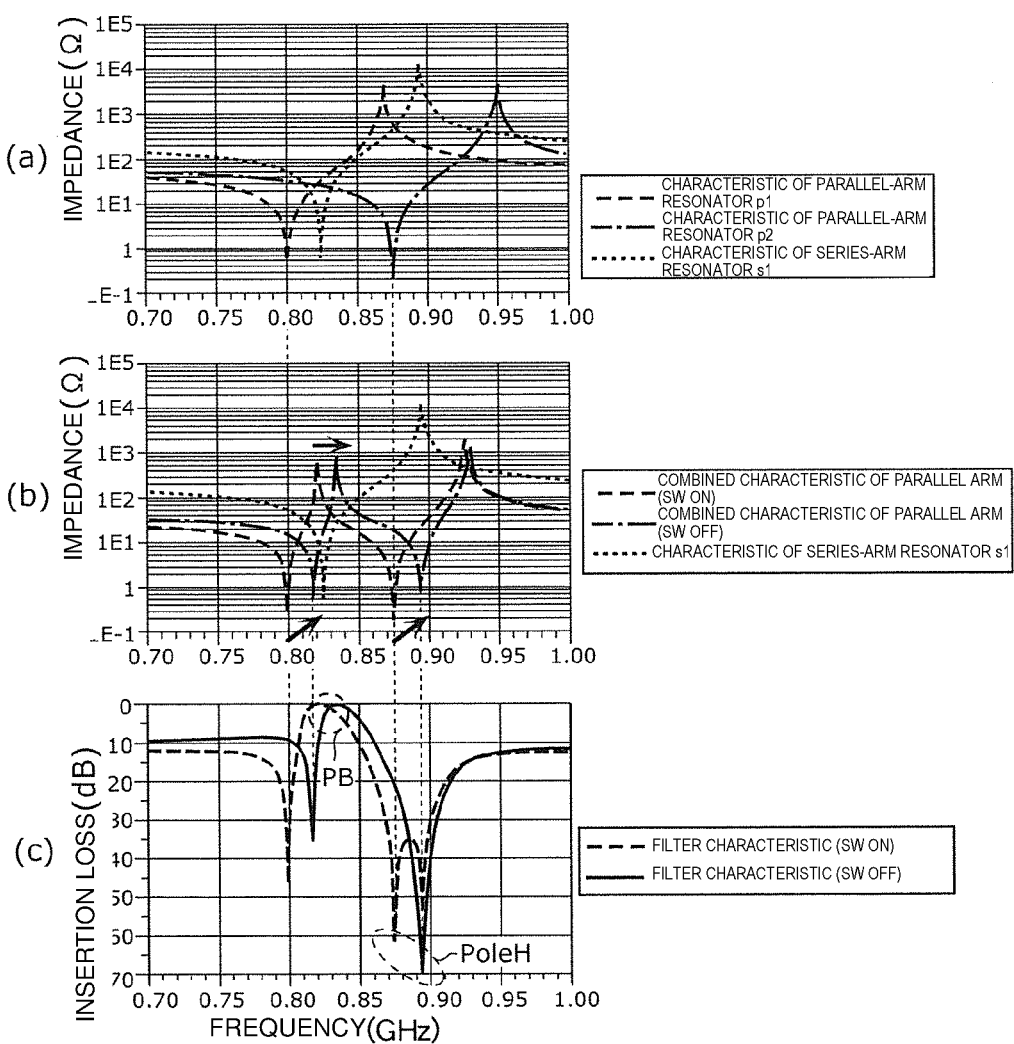
FIG. 11B illustrates graphs depicting characteristics of the filter in the Application Example 3 of the Preferred Embodiment 2 of the present invention.

FIG. 11B illustrates graphs depicting characteristics of the filter 20C in the Application Example 3 of the Preferred Embodiment 2. Specifically, as in parts (a) and (b) of FIG. 10B, parts (a) and (b) of FIG. 11B are graphs depicting the impedance characteristics of resonators alone and combined impedance characteristics of a parallel-arm resonant circuit (in the present application example, a circuit defined by the parallel-arm resonators p1 and p2, the capacitors C1 and C2, and the switches SW1 and SW2). Part (c) of FIG. 11B is a graph depicting a comparison of filter characteristics during on/off periods of both of the switches SW1 and SW2.

In the present application example, during the off period of both of the switches SW1 and SW2, the capacitor C1 is added to the parallel-arm resonator p1 and the capacitor C2 is added to the parallel-arm resonator p2. Thus, as indicated by solid black arrows in part (b) of FIG. 11B, when the switches SW1 and SW2 are both switched from on to off, in the impedance characteristic of the parallel-arm resonant circuit ("combined characteristic of parallel arm" in FIG. 11B), both of the two resonant frequencies and the lower anti-resonant frequency of the two anti-resonant frequencies are shifted to higher ranges.

Accordingly, as illustrated in part (c) of FIG. 11B, the switches SW1 and SW2 are both switched from on to off, thus switching the bandpass characteristic of the filter 20C from the first bandpass characteristic to a second bandpass characteristic in which the attenuation slopes on the high-frequency side of the pass band and the low-frequency side of the pass band are shifted to higher ranges with their steepness maintained. In other words, the filter 20C is able to switch the attenuation pole frequencies on the high-frequency side of the pass band and the low-frequency side of the pass band in accordance with switching between the connection and disconnection of the switches SW1 and SW2, and are able to reduce or prevent the increase in insertion loss at the high-frequency end of the pass band and at the low-frequency end of the pass band. Thus, for example, the filter 20C is able to shift the center frequency while maintaining the band width.

Even with the filter 20C having the configuration described above, in which the IDT electrode in the parallel-arm resonator p2 has a higher duty ratio than the IDT electrode in the parallel-arm resonator p1, as in Preferred Embodiment 1, for each of the first bandpass characteristic and the second bandpass characteristic, low loss and improved sharpness on the high-frequency side of the pass band are able to be achieved. That is, the filter 20C defines a tunable filter that is able to achieve low loss and improved sharpness on the high-frequency side of the pass band.

The filter 20C may not necessarily turn on/off the switches SW1 and SW2 together, and may turn on/off the switches SW1 and SW2 separately. However, turning on/off the switches SW1 and SW2 together reduces the number of control lines to control the switches SW1 and SW2, thus achieving a simplified configuration of the filter 20C.

In contrast, turning on/off the switches SW1 and SW2 separately may provide more variations in the pass band that are able to be switched by the filter 20C.

Specifically, as described for the filter 20A, the high-frequency end of the pass band is able to be varied in accordance with the on and off of the switch SW2 connected in series with the parallel-arm resonator p2. Further, as described for the filter 20B, the low-frequency end of the pass band is able to be varied in accordance with the on and off of the switch SW1 connected in series with the parallel-arm resonator p1.

Thus, turning on or off both of the switches SW1 and SW2 shifts the low-frequency end and the high-frequency end of the pass band to lower ranges or higher ranges. That is, the center frequency of the pass band is able to be shifted to a lower range or a higher range. In addition, switching one of the switches SW1 and SW2 from on to off and the other switch from off to on shifts both of the low-frequency end and the high-frequency end of the pass band so as to increase or reduce the frequency difference. That is, the width of the pass band is able to be varied with the center frequency of the pass band maintained constant or substantially constant. Additionally, while keeping one of the switches SW1 and SW2 in the on or off state, turning on and off the other switch shifts, with one of the low-frequency end and the high-frequency end of the pass band fixed, the other frequency end to a lower range or a higher range. That is, the low-frequency end or the high-frequency end of the pass band is able to be changed.

Accordingly, the use of the capacitors C1 and C2 and the switches SW1 and SW2 is able to improve the flexibility of changing the pass band.

Application Example 4

Figure 12A:
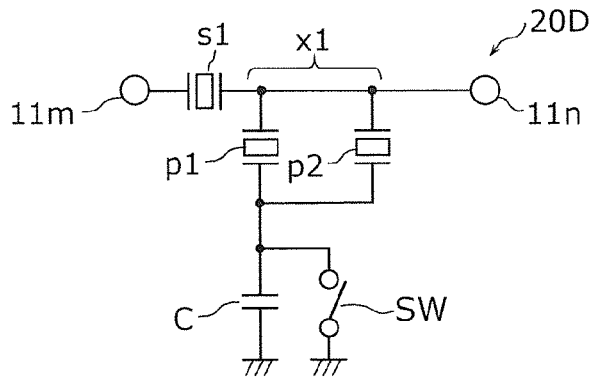
FIG. 12A is a circuit configuration diagram of a filter in an Application Example 4 of the Preferred Embodiment 2 of the present invention.

FIG. 12A is a circuit configuration diagram of a filter 20D in an Application Example 4 of the Preferred Embodiment 2.

In the filter 20D illustrated in FIG. 12A, unlike the filter 20A illustrated in FIG. 9A, the capacitor C and the switch SW, which are connected in parallel, are connected in series with a circuit including the parallel-arm resonator p1 and the parallel-arm resonator p2 connected in parallel.

Figure 12B:
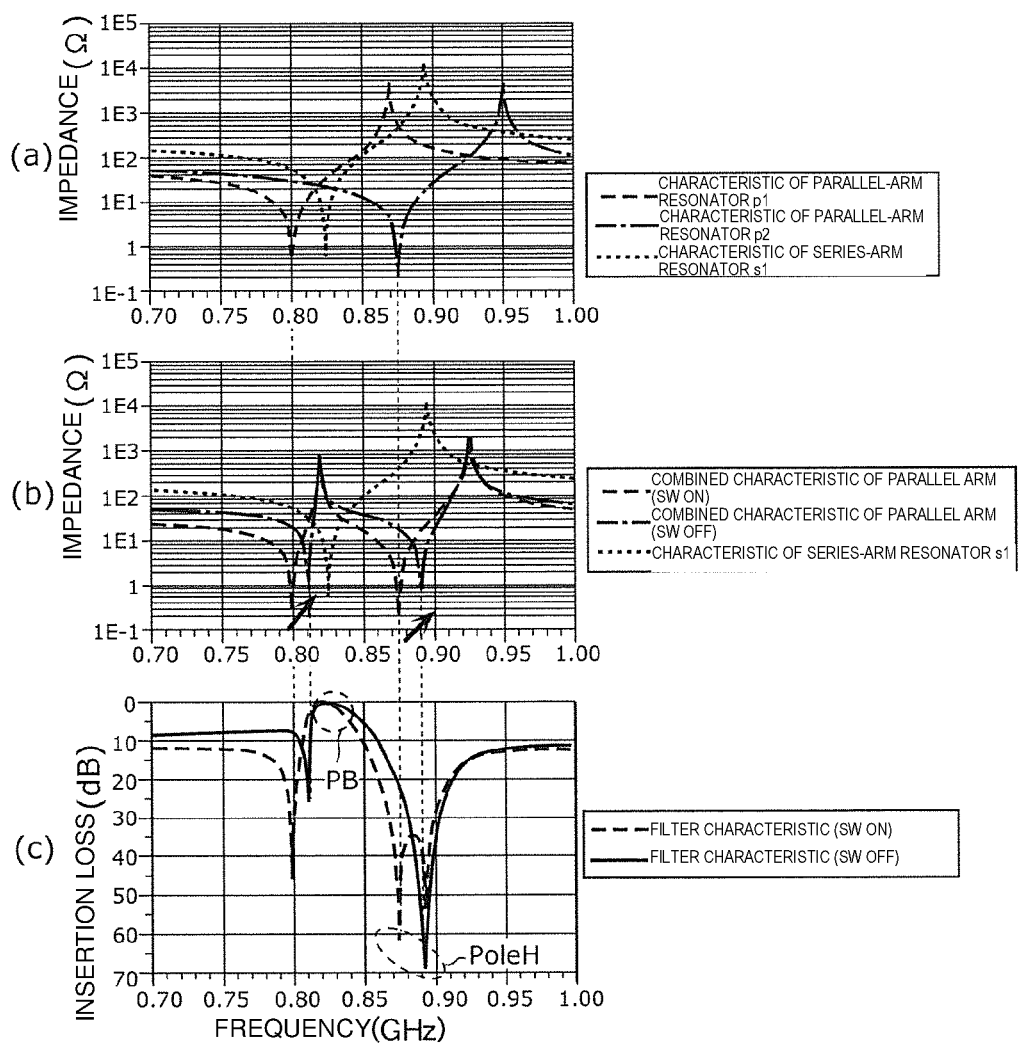
FIG. 12B illustrates graphs depicting characteristics of the filter in the Application Example 4 of the Preferred Embodiment 2 of the present invention.

FIG. 12B illustrates graphs depicting characteristics of the filter 20D in the Application Example 4 of the Preferred Embodiment 2. Specifically, as in parts (a) and (b) of FIG. 10B, parts (a) and (b) of FIG. 12B are graphs depicting the impedance characteristics of resonators alone and combined impedance characteristics of a parallel-arm resonant circuit. Part (c) of FIG. 12B is a graph depicting a comparison of filter characteristics during on/off periods of the switch SW.

In the present application example, during the off period of the switch SW, the capacitor C is added to the parallel-arm resonators p1 and p2, which are connected in parallel. Thus, as indicated by solid black arrows in part (b) of FIG. 12B, when the switch SW is switched from on to off, in the impedance characteristic of the parallel-arm resonant circuit ("combined characteristic of parallel arm" in FIG. 12B), neither of the two anti-resonant frequencies is shifted, whereas both of the two resonant frequencies are shifted to higher ranges.

Accordingly, as illustrated in part (c) of FIG. 12B, the switch SW is switched from on to off, thus switching the bandpass characteristic of the filter 20D from the first bandpass characteristic to a second bandpass characteristic in which both of the poles (attenuation poles) on both sides of the pass band are shifted to higher ranges.

Even with the filter 20D having the configuration described above, in which the IDT electrode in the parallel-arm resonator p2 has a higher duty ratio than the IDT electrode in the parallel-arm resonator p1, as in Preferred Embodiment 1, for each of the first bandpass characteristic and the second bandpass characteristic, low loss and improved sharpness on the high-frequency side of the pass band are able to be achieved. That is, the filter 20D defines a tunable filter that is able to achieve low loss and improved sharpness on the high-frequency side of the pass band.

Application Example 5

Figure 13A:
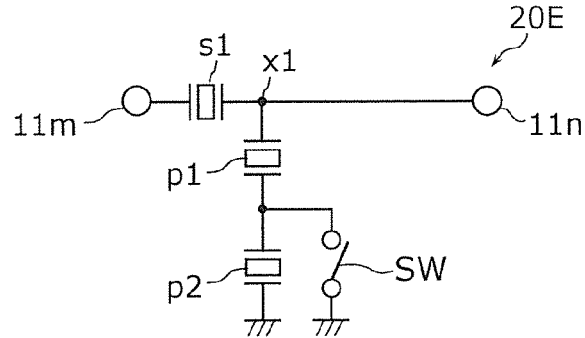
FIG. 13A is a circuit configuration diagram of a filter in an Application Example 5 of the Preferred Embodiment 2 of the present invention.

FIG. 13A is a circuit configuration diagram of a filter 20E in an Application Example 5 of the Preferred Embodiment 2.

Unlike the filter 10A illustrated in FIG. 7A, the filter 20E illustrated in FIG. 13A further includes a switch SW connected in parallel to one of the parallel-arm resonators p1 and p2 (first parallel-arm resonator and second parallel-arm resonator). In the present application example, the switch SW is connected in parallel to the parallel-arm resonator p2. If the specifications required for the filter 20E permit, for example, the diffraction loss of the parallel-arm resonator p2, the switch SW may be connected in parallel to the parallel-arm resonator p1.

Figure 13B:
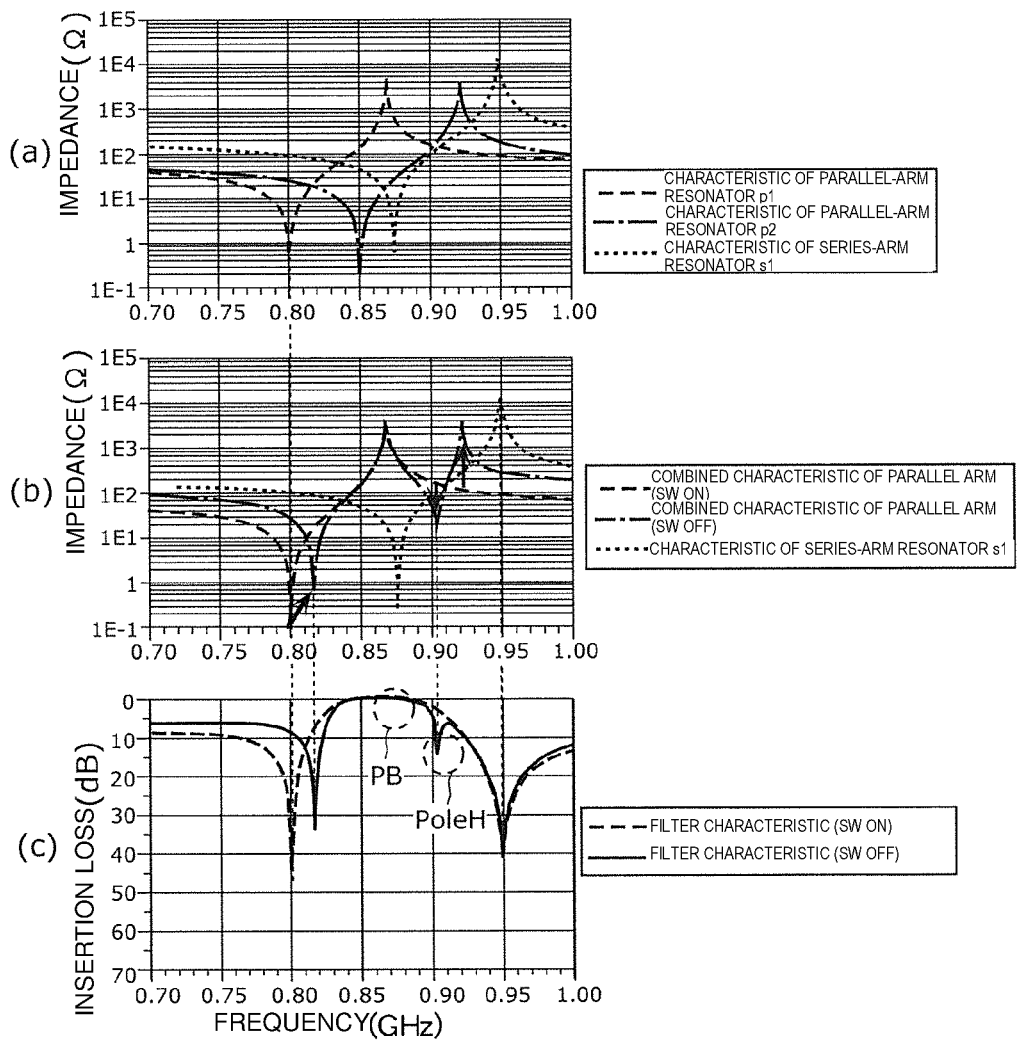
FIG. 13B illustrates graphs depicting characteristics of the filter in the Application Example 5 of the Preferred Embodiment 2 of the present invention.

FIG. 13B illustrates graphs depicting characteristics of the filter 20E in the Application Example 5 of the Preferred Embodiment 2. Specifically, as in parts (a) and (b) of FIG. 9B, parts (a) and (b) of FIG. 13B are graphs depicting the impedance characteristics of resonators alone and combined impedance characteristics of a parallel-arm resonant circuit (in the present application example, a circuit defined by the parallel-arm resonators p1 and p2 and the switch SW). Part (c) of FIG. 13B is a graph depicting a comparison of filter characteristics during on/off periods of the switch SW.

In the present application example, during the on period of the switch SW, the impedance characteristic of the parallel-arm resonant circuit ("combined characteristic of parallel arm" in FIG. 13B) corresponds to the impedance characteristic of the parallel-arm resonator p1 alone. During the off period of the switch SW, on the other hand, the parallel-arm resonator p2 is added to the parallel-arm resonator p1. Thus, as indicated by solid black arrows in part (b) of FIG. 13B, when the switch SW is switched from on to off, the impedance characteristic of the parallel-arm resonant circuit ("combined characteristic of parallel arm" in FIG. 13B) corresponds to the combined impedance characteristic of a series-connected circuit of the parallel-arm resonators p1 and p2.

Accordingly, as illustrated in part (c) of FIG. 13B, the switch SW is switched from on to off, thereby shifting, in the bandpass characteristic of the filter 20E, the attenuation pole on the low-frequency side of the pass band to a higher range. Additionally, an additional attenuation pole is generated on the high-frequency side of the pass band (indicated by PoleH in part (c) of FIG. 13B). Thus, attenuation on the high-frequency side of the pass band is also able to be obtained.

Even with the filter 20E having the configuration described above, in which the parallel-arm resonator p2 includes an IDT electrode having a higher duty ratio than that in the IDT electrode in the parallel-arm resonator p1, for a characteristic obtained by adding the parallel-arm resonator p2 to the parallel-arm resonator p1, as in the Preferred Embodiment 1, low loss and improved sharpness on the high-frequency side of the pass band is able to be achieved. That is, the filter 20E defines a tunable filter that is able to achieve low loss and improved sharpness on the high-frequency side of the pass band.

Preferred Embodiment 3

The filters (acoustic wave filter devices) provided in the Preferred Embodiments 1 and 2 described above and modifications thereto are applicable to multiplexers, radio-frequency front-end circuits, and other suitable devices.

In the present preferred embodiment, such a radio-frequency front-end circuit will be described.

Figure 14:
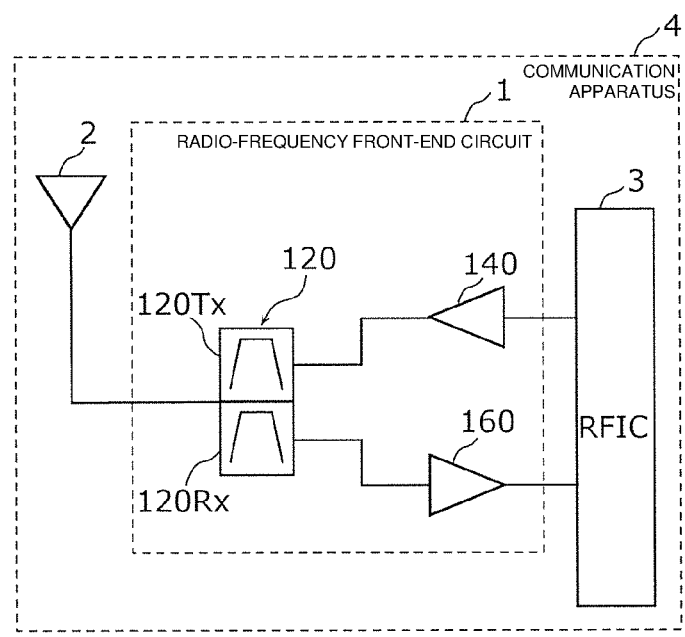
FIG. 14 is a configuration diagram of a radio-frequency front-end circuit according to a Preferred Embodiment 3 of the present invention and its peripheral circuit.

FIG. 14 is a configuration diagram of a radio-frequency front-end circuit 1 according to a Preferred Embodiment 3 of the present invention and its peripheral circuit. In FIG. 14, the radio-frequency front-end circuit 1, an antenna element 2, and an RF signal processing circuit (RFIC) 3 are illustrated. The radio-frequency front-end circuit 1 and the RFIC 3 define a communication apparatus 4. The antenna element 2, the radio-frequency front-end circuit 1, and the RFIC 3 are provided in a front-end portion of a multi-mode/multi-band cellular phone, for example.

The antenna element 2 is preferably a multi-band antenna complying with a communication standard such as LTE and configured to transmit and receive radio-frequency signals. For example, the antenna element 2 may not support all of the bands of the communication apparatus 4, and may support only bands in a low-frequency band group or a high-frequency band group. Further, the antenna element 2 may not be included in the communication apparatus 4, but may be provided separately from the communication apparatus 4.

The radio-frequency front-end circuit 1 transmits a radio-frequency signal between the antenna element 2 and the RFIC 3. Specifically, the radio-frequency front-end circuit 1 transmits a radio-frequency signal (here, a radio frequency transmission signal) output from the RFIC 3 to the antenna element 2 via a transmission-side signal path. Further, the radio-frequency front-end circuit 1 transmits a radio-frequency signal (here, a radio frequency reception signal) received by the antenna element 2 to the RFIC 3 via a reception-side signal path.

The radio-frequency front-end circuit 1 includes a duplexer 120, a transmission amplifier circuit 140, and a reception amplifier circuit 160.

The duplexer 120 is preferably a multiplexer including a transmission-side filter 120Tx and a reception-side filter 120Rx, at least one of which is provided with an acoustic wave filter device according to a preferred embodiment of the present invention. Each of the transmission-side filter 120Tx and the reception-side filter 120Rx includes an antenna-side input/output terminal connected to the antenna element 2, and another terminal connected to the transmission amplifier circuit 140 or the reception amplifier circuit 160.

The transmission amplifier circuit 140 is a power amplifier that amplifies the power of a radio frequency transmission signal output from the RFIC 3.

The reception amplifier circuit 160 is a low-noise amplifier that amplifies the power of a radio frequency reception signal received by the antenna element 2.

The RFIC 3 is preferably an RF signal processing circuit that processes a radio-frequency signal transmitted or received by the antenna element 2. Specifically, the RFIC 3 performs signal processing on a radio-frequency signal (here, a radio frequency reception signal) input from the antenna element 2 via the reception-side signal path of the radio-frequency front-end circuit 1 using down-conversion, for example, to generate a reception signal, and outputs the reception signal to a baseband signal processing circuit (not illustrated). Further, the RFIC 3 performs signal processing on a transmission signal input from the baseband signal processing circuit using up-conversion, for example, to generate a radio-frequency signal (here, a radio frequency transmission signal), and outputs the radio-frequency signal to the transmission-side signal path of the radio-frequency front-end circuit 1.

The radio-frequency front-end circuit 1 having the configuration described above is provided with an acoustic wave filter device according to a preferred embodiment of the present invention, and thus is able to achieve both low loss and high selectivity (prevention of mutual interference with other bands adjacent to its own band). This configuration is suitable for use in, in particular, the radio-frequency front-end circuit 1, which is applied to the communication apparatus 4 supporting multiple bands.

The filters (acoustic wave filter devices) provided in the Preferred Embodiments 1 and 2 described above and modifications thereto are also applicable to a radio-frequency front-end circuit supporting a system that uses more bands than the radio-frequency front-end circuit 1 according to the Preferred Embodiment 3. In the present modification, such a radio-frequency front-end circuit will be described.

Figure 15:
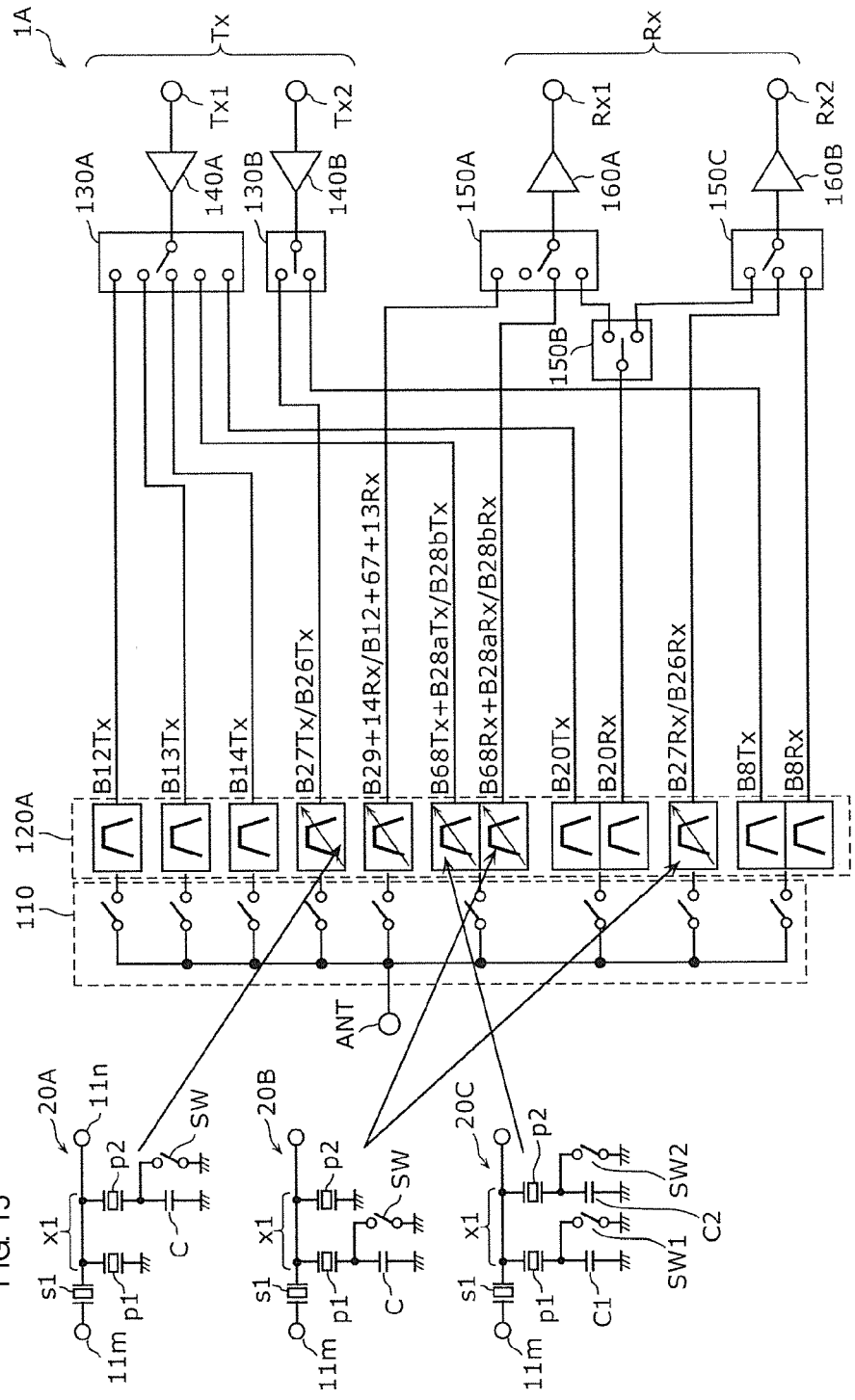
FIG. 15 is a configuration diagram of a radio-frequency front-end circuit according to a modification of the Preferred Embodiment 3 of the present invention.

FIG. 15 is a configuration diagram of a radio-frequency front-end circuit 1A according to a modification of the Preferred Embodiment 3.

As illustrated in FIG. 15, the radio-frequency front-end circuit 1A includes an antenna terminal ANT, transmission terminals Tx1 and Tx2, and reception terminals Rx1 and Rx2. The radio-frequency front-end circuit 1A further includes, in sequence from the antenna terminal ANT side, a switch group 110 including a plurality of switches, a filter group 120A including a plurality of filters, transmission-side switches 130A and 130B, reception-side switches 150A, 150B, and 150C, transmission amplifier circuits 140A and 140B, and reception amplifier circuits 160A and 160B.

The switch group 110 connects the antenna terminal ANT and a signal path supporting a predetermined band in accordance with a control signal from a control unit (not illustrated). The switch group 110 preferably includes, for example, a plurality of SPST switches. The number of signal paths to be connected to the antenna terminal ANT is not limited to one, and a plurality of signal paths may be connected to the antenna terminal ANT. That is, the radio-frequency front-end circuit 1A may support carrier aggregation.

The filter group 120A includes, for example, a plurality of filters (including a duplexer) preferably having the following bands as a pass band, for example. Specifically, the bands are: (i) the transmission band of Band 12, (ii) the transmission band of Band 13, (iii) the transmission band of Band 14, (iv) the transmission band of Band 27 (or Band 26), (v) the reception bands of Band 29 and Band 14 (or Band 12, Band 67, and Band 13), (vi-Tx) the transmission bands of Band 68 and Band 28a (or Band 68 and Band 28b), (vi-Rx) the reception bands of Band 68 and Band 28a (or Band 68 and Band 28b), (vii-Tx) the transmission band of Band 20, (vii-Rx) the reception band of Band 20, (viii) the reception band of Band 27 (or Band 26), (ix-Tx) the transmission band of Band 8, and (ix-Rx) the reception band of Band 8.

The transmission-side switch 130A includes a plurality of selection terminals connected to a plurality of low-band transmission-side signal paths, and a common terminal connected to the transmission amplifier circuit 140A. The transmission-side switch 130B includes a plurality of selection terminals connected to a plurality of high-band transmission-side signal paths, and a common terminal connected to the transmission amplifier circuit 140B. The transmission-side switches 130A and 130B are disposed in the preceding stage of the filter group 120A (here, in the preceding stage in the transmission-side signal path) and are each configured such that the connection state is switched in accordance with a control signal from the control unit (not illustrated). Accordingly, radio-frequency signals (here, radio frequency transmission signals) amplified by the transmission amplifier circuits 140A and 140B are output from the antenna terminal ANT to the antenna element 2 (see FIG. 14) via predetermined filters in the filter group 120A.

The reception-side switch 150A includes a plurality of selection terminals connected to a plurality of low-band reception-side signal paths, and a common terminal connected to the reception amplifier circuit 160A. The reception-side switch 150B includes a common terminal connected to a reception-side signal path for a predetermined band (here, Band 20), and two selection terminals connected to the selection terminal of the reception-side switch 150A and the selection terminal of the reception-side switch 150C. The reception-side switch 150C includes a plurality of selection terminals connected to a plurality of high-band reception-side signal paths, and a common terminal connected to the reception amplifier circuit 160B. The reception-side switches 150A to 150C are disposed in the subsequent stage of the filter group 120A (here, in the subsequent stage in the reception-side signal path) and are each configured such that the connection state is switched in accordance with a control signal from the control unit (not illustrated). Accordingly, radio-frequency signals (here, radio frequency reception signals) input to the antenna terminal ANT are amplified by the reception amplifier circuits 160A and 160B via predetermined filters in the filter group 120A and are output from the reception terminals Rx1 and Rx2 to the RFIC 3 (see FIG. 14). An RFIC supporting low bands and an RFIC supporting high bands may be separately provided.

The transmission amplifier circuit 140A is a power amplifier that amplifies the power of a low-band radio frequency transmission signal, and the transmission amplifier circuit 140B is a power amplifier that amplifies the power of a high-band radio frequency transmission signal.

The reception amplifier circuit 160A is a low-noise amplifier that amplifies the power of a low-band radio frequency reception signal, and the reception amplifier circuit 160B is a low-noise amplifier that amplifies the power of a high-band radio frequency reception signal.

The radio-frequency front-end circuit 1A having the configuration described above preferably includes the filter 20A according to the Application Example 1 of the Preferred Embodiment 2 as a filter having (iv) the transmission band of Band 27 (or Band 26) as a pass band. That is, this filter switches the pass band between the transmission band of Band 27 and the transmission band of Band 26 in accordance with a control signal.

Further, the radio-frequency front-end circuit 1A preferably includes the filter 20B according to the Application Example 2 of the Preferred Embodiment 2 as a reception filter having (vi-Rx) the reception bands of Band 68 and Band 28a (or Band 68 and Band 28b) as a pass band, and further preferably includes the filter 20C according to the Application Example 3 of the Preferred Embodiment 2 as a transmission filter having (vi-Tx) the transmission bands of Band 68 and Band 28a (or Band 68 and Band 28b) as a pass band. That is, a duplexer defined by the transmission filter and the reception filter switches the pass band between the transmission bands of Band 68 and Band 28a and the transmission bands of Band 68 and Band 28b and switches the pass band between the reception bands of Band 68 and Band 28a and the reception bands of Band 68 and Band 28b in accordance with a control signal.

Further, the radio-frequency front-end circuit 1A preferably includes the filter 20B according to the Application Example 2 of the Preferred Embodiment 2 as a filter having (viii) the reception band of Band 27 (or Band 26) as a pass band. That is, this filter switches the pass band between the reception band of Band 27 and the reception band of Band 26 in accordance with a control signal.

The radio-frequency front-end circuit 1A having the configuration described above preferably includes the filters 20A to 20C (acoustic wave filter devices) according to the Application Examples 1 to 3 of the Preferred Embodiment 2 described above, which reduces the number of filters, compared with when a filter is disposed for each band, and thus is reduced in size.

Furthermore, the radio-frequency front-end circuit 1A according to the present preferred embodiment includes the transmission-side switches 130A and 130B and the reception-side switches 150A to 150C (switch circuits) in the preceding stage or subsequent stage of the filter group 120A (a plurality of acoustic wave filter devices). This configuration enables some of signal paths along which radio-frequency signals are transmitted to be shared. Thus, for example, the transmission amplifier circuits 140A and 140B or the reception amplifier circuits 160A and 160B (amplifier circuits) corresponding to a plurality of acoustic wave filter devices are able to be shared. Accordingly, the size and cost of the radio-frequency front-end circuit 1A are able to be reduced.

At least one of the transmission-side switches 130A and 130B and at least one of the reception-side switches 150A to 150C may be provided. The number of transmission-side switches 130A and 130B and the number of reception-side switches 150A to 150C are not limited to those described above, and, for example, a single transmission-side switch and a single reception-side switch may be provided. In addition, the number of selection terminals of a transmission-side switch and a reception-side switch is not limited to that in the present preferred embodiment, and a transmission-side switch and a reception-side switch may each include two selection terminals.

Alternatively, the configurations of the filters according to the Preferred Embodiment 1 and the modification thereof may be applied to at least one filter among a plurality of filters included in a filter group.

While acoustic wave filter devices and radio-frequency front-end circuits according to preferred embodiments of the present invention have been described with reference to the Preferred Embodiments 1 to 3 and modifications thereof, the present invention is not limited to the preferred embodiments and modifications described above. Any of the elements in the preferred embodiments and modifications described above may be combined to provide other preferred embodiments, or various modifications conceived by a person skilled in the art without departing from the gist of the present invention may be made to the preferred embodiments. Such preferred embodiments and modifications and various devices including acoustic wave filter devices and radio-frequency front-end circuits according to preferred embodiments of the present invention are also included in the present invention.

For example, the communication apparatus 4 including the radio-frequency front-end circuit described above and the RFIC 3 (RF signal processing circuit) is also included in preferred embodiments of the present invention. The communication apparatus 4 having the configuration described above is able to achieve low loss and high selectivity.

Furthermore, the IDT electrodes included in the series-arm resonator s1 and the parallel-arm resonators p1 and p2 may have the same or different aspect ratios. However, in terms of improved filter characteristics, the IDT electrode 131 included in the parallel-arm resonator p2 preferably has a lower aspect ratio than the IDT electrode 121 included in the parallel-arm resonator p1.

Figure 16:
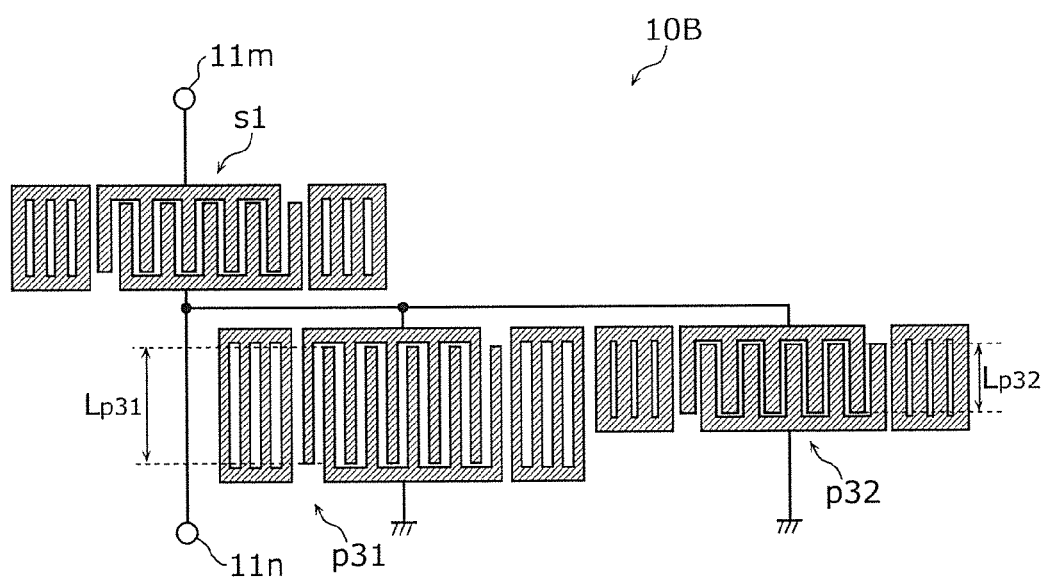
FIG. 16 is a schematic plan view of an electrode structure of a filter according to another preferred embodiment of the present invention.

FIG. 16 is a schematic plan view of an electrode structure of a filter 10B having the configuration described above. An IDT electrode in a parallel-arm resonator p32 (second parallel-arm resonator) has a lower aspect ratio than an IDT electrode in a parallel-arm resonator p31 (first parallel-arm resonator), where the aspect ratio is the ratio of an overlap width of a plurality of electrode fingers to the number of pairs of electrode fingers. That is, when the overlap widths L of the IDT electrode in the parallel-arm resonator p31 and the IDT electrode in the parallel-arm resonator p32 are denoted by $L_{p1}$ and $L_{p2}$, respectively, and the numbers N of pairs of electrode fingers of the IDT electrode in the parallel-arm resonator p31 and the IDT electrode in the parallel-arm resonator p32 are denoted by $N_{p1}$ and $N_{p2}$, respectively, then in the present preferred embodiment, the aspect ratio L/N preferably satisfies $L_{p1}/N_{p1} > L_{p2}/N_{p2}$. In FIG. 16, the numbers of pairs of electrode fingers of the IDT electrodes of the resonators are illustrated as being equal. In actual design, however, it is rare that the numbers of pairs of electrode fingers of the IDT electrodes are equal. That is, design parameters, such as the numbers of pairs of electrode fingers and the overlap widths of the IDT electrodes of the resonators may be determined, as desired, in accordance with specifications required for each resonator. That is, here, the IDT electrode in the parallel-arm resonator p32 preferably has a higher duty ratio and a lower aspect ratio than the IDT electrode in the parallel-arm resonator p31.

The inventor of preferred embodiments of the present invention has discovered that the change in the Qs at the resonant frequency and the anti-resonant frequency of a resonator depends not only on the duty ratio of an IDT electrode of the resonator but also on the aspect ratio of the IDT electrode of the resonator, which may be utilized to improve filter characteristics. That is, for impedance characteristics of a resonator alone, the higher the duty ratio and the lower the aspect ratio of the IDT electrode, the higher the Q at the resonant frequency becomes. Conversely, the lower the duty ratio and the higher the aspect ratio of the IDT electrode, the higher the Q at the anti-resonant frequency becomes. For filter characteristics, as the Q at the resonant frequency of the parallel-arm resonator p32 and the Q at the anti-resonant frequency of the parallel-arm resonator p31 increase, a lower loss within the pass band is able to be achieved and the sharpness on the high-frequency side of the pass band is able to be improved. Accordingly, the duty ratio of the IDT electrode of the parallel-arm resonator p32 is set to be higher than the duty ratio of the IDT electrode of the parallel-arm resonator p31, and the aspect ratio of the IDT electrode of the parallel-arm resonator p32 is set to be lower than the aspect ratio of the IDT electrode of the parallel-arm resonator p31. This achieves lower loss within the pass band and further improved sharpness on the high-frequency side of the pass band.

Furthermore, the series-arm resonator s1 is not limited to an acoustic wave resonator that uses a surface acoustic wave, and may be, for example, an acoustic wave resonator that uses a bulk wave or a boundary acoustic wave. That is, the series-arm resonator s1 may not include an IDT electrode. Even an acoustic wave filter device including the series-arm resonator s1 having this configuration is able to achieve both low loss and high selectivity (prevention of mutual interference with other bands adjacent to its own band) since an acoustic wave resonator generally has a high-Q characteristic.

Furthermore, in terms of low loss, each resonator preferably includes reflectors. However, for example, if there are constraints on the mounting layout and other parameters, a resonator may not include a reflector.

Furthermore, for example, in a radio-frequency front-end circuit or a communication apparatus, an inductor or a capacitor may be connected between individual components. The inductor may include a wiring inductor including wiring that connects individual components.

Preferred embodiments of the present invention provide compact filters, multiplexers, front-end circuits, and communication apparatuses applicable to a multi-band system, which may be widely used in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. an acoustic wave filter device comprising:
    a series-arm resonant circuit connected on a path connecting a first input/output terminal and a second input/output terminal; and
    a first parallel-arm resonator and a second parallel-arm resonator connected between a node on the path and ground; wherein,
    a resonant frequency of the second parallel-arm resonator is higher than a resonant frequency of the first parallel-arm resonator;
    an anti-resonant frequency of the second parallel-arm resonator is higher than an anti-resonant frequency of the first parallel-arm resonator;
    each of the first parallel-arm resonator and the second parallel-arm resonator includes an acoustic wave resonator including an IDT electrode; and
    the IDT electrode in the second parallel-arm resonator has a duty ratio that is higher than a duty ratio of the IDT electrode in the first parallel-arm resonator, the duty ratio being a ratio of a width of a plurality of electrode fingers to a pitch of the plurality of electrode fingers included in the corresponding IDT electrode.

2. The acoustic wave filter device according to claim 1, wherein
    the series-arm resonant circuit includes an acoustic wave resonator including an IDT electrode; and
    the duty ratio of the IDT electrode in the first parallel-arm resonator is lower than a duty ratio of the IDT electrode in the series-arm resonant circuit.

3. The acoustic wave filter device according to claim 1, wherein the first parallel-arm resonator and the second parallel-arm resonator are connected in parallel.

4. The acoustic wave filter device according to claim 3, further comprising:
    an impedance element and a switch element that are connected in parallel and that are connected in series with at least one of the first parallel-arm resonator and the second parallel-arm resonator.

5. The acoustic wave filter device according to claim 4, wherein the impedance element and the switch element that are connected in parallel are connected in series with only the second parallel-arm resonator of the first and second parallel-arm resonators.

6. The acoustic wave filter device according to claim 4, wherein the impedance element and the switch element that are connected in parallel are connected in series with only the first parallel-arm resonator of the first and second parallel-arm resonators.

7. The acoustic wave filter device according to claim 4, wherein the impedance element and the switch element that are connected in parallel are connected in series with a circuit including the first parallel-arm resonator and the second parallel-arm resonator connected in parallel.

8. The acoustic wave filter device according to claim 3, further comprising:
    an impedance element and a switch element that are connected in parallel and that are connected in series with only the first parallel-arm resonator of the first and second parallel-arm resonators; and
    another impedance element and another switch element that are connected in parallel and that are connected in series with only the second parallel-arm resonator of the first and second parallel-arm resonators.

9. The acoustic wave filter device according to claim 1, wherein the first parallel-arm resonator and the second parallel-arm resonator are connected in series.

10. The acoustic wave filter device according to claim 1, wherein the first parallel-arm resonator and the second parallel-arm resonator are connected in series; and
    the acoustic wave filter device further includes a switch element connected in parallel to one of the first parallel-arm resonator and the second parallel-arm resonator.

11. The acoustic wave filter device according to claim 1, wherein the IDT electrode in the second parallel-arm resonator has a lower aspect ratio than the IDT electrode in the first parallel-arm resonator, the aspect ratio being a ratio of an overlap width of the plurality of electrode fingers to a number of pairs of electrode fingers in the corresponding IDT electrode.

12. The acoustic wave filter device according to claim 1, wherein
    the series-arm resonant circuit is a series-arm resonator including one or more acoustic wave resonators; and
    the series-arm resonant circuit, the first parallel-arm resonator, and the second parallel-arm resonator define a ladder filter structure.

13. The acoustic wave filter device according to claim 1, wherein the series-arm resonant circuit is a longitudinally coupled resonator including a plurality of acoustic wave resonators.

14. A radio-frequency front-end circuit comprising:
    the acoustic wave filter device according to claim 1; and
    an amplifier circuit connected to the acoustic wave filter device.

15. The radio-frequency front-end circuit according to claim 14, wherein
    the series-arm resonant circuit includes an acoustic wave resonator including an IDT electrode; and
    the duty ratio of the IDT electrode in the first parallel-arm resonator is lower than a duty ratio of the IDT electrode in the series-arm resonant circuit.

16. The radio-frequency front-end circuit according to claim 14, wherein the first parallel-arm resonator and the second parallel-arm resonator are connected in parallel.

17. The radio-frequency front-end circuit according to claim 16, further comprising:

an impedance element and a switch element that are connected in parallel and that are connected in series with at least one of the first parallel-arm resonator and the second parallel-arm resonator.

18. The radio-frequency front-end circuit according to claim 17, wherein the impedance element and the switch element that are connected in parallel are connected in series with only the second parallel-arm resonator of the first and second parallel-arm resonators.

19. The radio-frequency front-end circuit according to claim 17, wherein the impedance element and the switch element that are connected in parallel are connected in series with only the first parallel-arm resonator of the first and second parallel-arm resonators.

20. A communication apparatus comprising:
an RF signal processing circuit that processes a radio-frequency signal transmitted or received by an antenna element; and
the radio-frequency front-end circuit according to claim 14 that transmits the radio-frequency signal between the antenna element and the RF signal processing circuit.

* * * * *